US00RE46515E

(19) United States
(12) Reissued Patent
Ji et al.

(10) Patent Number: US RE46,515 E
(45) Date of Reissued Patent: Aug. 15, 2017

(54) SOLAR CELL

(71) Applicant: LG ELECTRONICS INC., Seoul (KR)

(72) Inventors: Kwangsun Ji, Seoul (KR); Heonmin Lee, Seoul (KR); Hojung Syn, Seoul (KR); Wonseok Choi, Seoul (KR); Junghoon Choi, Seoul (KR); Hyunjin Yang, Seoul (KR)

(73) Assignee: LG ELECTRONICS INC., Seoul (KR)

(21) Appl. No.: 14/843,778

(22) Filed: Sep. 2, 2015

Related U.S. Patent Documents

Reissue of:
(64) Patent No.: 8,525,018
Issued: Sep. 3, 2013
Appl. No.: 12/876,821
Filed: Sep. 7, 2010

(30) Foreign Application Priority Data

Sep. 7, 2009 (KR) ..... 10-2009-0084046
May 11, 2010 (KR) ..... 10-2010-0043961

(51) Int. Cl.
*H01L 31/00* (2006.01)
*H01L 31/0216* (2014.01)
(Continued)

(52) U.S. Cl.
CPC ..... *H01L 31/02167* (2013.01); *H01L 31/022441* (2013.01); *H01L 31/0747* (2013.01); *Y02E 10/50* (2013.01)

(58) Field of Classification Search
CPC ..... H01L 31/02167; H01L 31/0747; H01L 31/022441; Y02E 10/50
See application file for complete search history.

(56) References Cited

U.S. PATENT DOCUMENTS 6,313,397 B1 11/2001 Washio et al.
6,387,726 B1 5/2002 Verlinden et al.
(Continued)

FOREIGN PATENT DOCUMENTS

CN 2004-39751 A 2/2004
CN 1862840 A 11/2006
(Continued)

OTHER PUBLICATIONS

Granek, "Enhanced Lateral Current Transport Via the Front N+ Diffused Layer of N-type High-efficiency Back-junction Back-contact Silicon Solar Cells," Progress in Photovoltaics: Research and Applications, vol. 17, pp. 47-56, published online Oct. 29, 2008.*

(Continued)

*Primary Examiner* — Alan Diamond
(74) *Attorney, Agent, or Firm* — Birch, Stewart, Kolasch & Birch, LLP

(57) ABSTRACT

A solar cell is discussed. The solar cell includes a substrate of a first conductive type, an emitter region of a second conductive type opposite the first conductive type that is positioned on the substrate, a first field region of the first conductive type that is positioned on the substrate to be separated from the emitter region, a first electrode electrically connected to the emitter region, a second electrode electrically connected to the first field region, and an insulating region positioned on at least one of the emitter region and the first field region.

48 Claims, 26 Drawing Sheets

(51) Int. Cl.

| | |
|---|---|
| ***H01L 31/0224*** | (2006.01) |
| ***H01L 31/0352*** | (2006.01) |
| ***H01L 31/04*** | (2014.01) |
| ***H01L 31/042*** | (2014.01) |
| ***H01L 31/072*** | (2012.01) |
| ***H01L 31/0747*** | (2012.01) |
| ***H01L 31/0376*** | (2006.01) |
| ***H01L 31/0368*** | (2006.01) |
| ***H01L 31/068*** | (2012.01) |
| ***H01L 31/18*** | (2006.01) |

(56) References Cited

U.S. PATENT DOCUMENTS

| | | | | |
|---|---|---|---|---|
| 6,927,417 | B2 * | 8/2005 | Nagashima et al. | 257/55 |
| 7,339,110 | B1 | 3/2008 | Mulligan et al. | |
| 7,468,485 | B1 | 12/2008 | Swanson | |
| 2004/0200520 | A1 | 10/2004 | Mulligan et al. | |
| 2005/0062041 | A1 * | 3/2005 | Terakawa | H01L 31/0747 257/53 |
| 2006/0196535 | A1 | 9/2006 | Swanson et al. | |
| 2006/0255340 | A1 | 11/2006 | Manivannan et al. | |
| 2007/0169808 | A1 * | 7/2007 | Kherani et al. | 136/258 |
| 2007/0199591 | A1 * | 8/2007 | Harder | H01L 31/02168 136/252 |
| 2008/0000522 | A1 | 1/2008 | Johnson et al. | |
| 2008/0076203 | A1 | 3/2008 | Ribeyron et al. | |
| 2008/0156370 | A1 | 7/2008 | Abdallah et al. | |
| 2008/0173347 | A1 | 7/2008 | Korevaar et al. | |
| 2008/0283490 | A1 | 11/2008 | Luan et al. | |
| 2009/0014063 | A1 | 1/2009 | Stangl et al. | |
| 2009/0151784 | A1 | 6/2009 | Luan et al. | |
| 2009/0227061 | A1 | 9/2009 | Bateman et al. | |
| 2009/0227095 | A1 | 9/2009 | Bateman et al. | |
| 2009/0266401 | A1 | 10/2009 | Stangl et al. | |
| 2010/0051085 | A1 * | 3/2010 | Weidman | H01L 31/02244 136/244 |
| 2010/0055822 | A1 | 3/2010 | Weidman et al. | |
| 2010/0147378 | A1 | 6/2010 | Lee et al. | |
| 2010/0193027 | A1 * | 8/2010 | Ji | H01L 31/02168 136/256 |
| 2011/0000532 | A1 * | 1/2011 | Niira et al. | 136/255 |
| 2011/0041902 | A1 | 2/2011 | Krokoszinski et al. | |
| 2011/0143480 | A1 | 6/2011 | Hilali et al. | |

FOREIGN PATENT DOCUMENTS

| | | | |
|---|---|---|---|
| CN | 1862840 | A | 11/2006 |
| CN | 1873840 | A1 | 1/2008 |
| CN | 101097969 | A | 1/2008 |
| CN | 101401215 | A | 4/2009 |
| EP | 1873840 | A1 | 1/2008 |
| JP | 2003-152207 | A | 5/2003 |
| JP | 2004-39751 | A | 2/2004 |
| JP | 2009-524916 | A | 7/2009 |
| KR | 10-2005-0039273 | A | 4/2005 |
| KR | 10-2007-0079749 | A | 8/2007 |
| KR | 10-0757797 | B1 | 9/2007 |
| KR | 101097969 | A | 1/2008 |
| KR | 10-2010-0068832 | A | 6/2010 |
| WO | WO 2007/140763 | A2 | 12/2007 |
| WO | WO 2009/096539 | A1 | 8/2009 |
| WO | WO 2009/101107 | A1 | 8/2009 |

OTHER PUBLICATIONS

Diouf et al, "Effects of the front surface field in n-type interdigitated back contact silicon heterojunction solar cells," Energy Procedia 2 (2010), pp. 59-64, available online Aug. 4, 2010.*

Lu et al., "Rear surface passivation of interdigitated back contact silicon heterojunction solar cell and 2D simulation study," 33rd IEEE Photovoltaic Specialist Conference, May 11-16, 2008.*

* cited by examiner

SOLAR CELL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application *is a reissue application of U.S. Pat. No. 8,525,018 B2 issued Sep. 3, 2013, which* claims priority to and the benefit of Korean Patent Application No. 10-2009-0084046 and No. 10-2010-0043961 filed in the Korean Intellectual Property Office on Sep. 7, 2009 and May 11, 2010, the entire contents of which are incorporated herein by reference.

BACKGROUND OF THE INVENTION

1. Field of the Invention

Embodiments of the invention relate to a solar cell.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductive types, such as a p-type and an n-type, and form a p-n junction, and electrodes respectively connected to the semiconductor parts of the different conductive types.

When light is incident on the solar cell, a plurality of electron-hole pairs are generated in the semiconductor parts. The electron-hole pairs are separated into electrons and holes by the photovoltaic effect. Thus, the separated electrons move to the n-type semiconductor and the separated holes move to the p-type semiconductor, and then the electrons and holes are collected by the electrodes electrically connected to the n-type semiconductor and the p-type semiconductor, respectively. The electrodes are connected to each other using electric wires to thereby obtain electric power.

SUMMARY OF THE INVENTION

In one aspect, there is a solar cell including a substrate of a first conductive type, an emitter region of a second conductive type opposite the first conductive type that is positioned on the substrate, a first field region of the first conductive type that is positioned on the substrate to be separated from the emitter region, a first electrode electrically connected to the emitter region, a second electrode electrically connected to the first field region, and an insulating region positioned on at least one of the emitter region and the first field region.

When the insulating region is positioned on the first field region, the insulating region may be positioned on an edge of the first field region.

When the insulating region is positioned on the first field region, the insulating region may have at least one opening exposing a portion of the first field region.

The insulating region may be positioned between the emitter region and the first field region.

The insulating region may include a portion directly contacting the substrate.

The insulating region may directly contact the substrate exposed between the emitter region and the first field region.

The emitter region may include a first portion positioned at a first height and a second portion positioned at a second height greater than the first height.

When the insulating region is positioned on the emitter region, the insulating region may be positioned on the first portion of the emitter region.

The insulating region may have at least one opening exposing a portion of the first portion of the emitter region.

The solar cell may further include a passivation layer positioned between the substrate and the first field region and between the substrate and the emitter region.

The passivation layer may include a first portion positioned between the substrate and the first field region and a second portion positioned between the substrate and the emitter region.

The second portion of the passivation layer may have the same plane shape as the emitter region.

The passivation layer may be positioned between the first field region and the emitter region.

The passivation layer may extend between the first field region and the emitter region and may be positioned between the insulating region and the emitter region.

The passivation layer may have at least one opening exposing the first portion of the emitter region.

When the insulating region is positioned on the emitter region and the first field region, the insulating region may be positioned on an edge of the emitter region and an edge of the first field region.

The solar cell may further include a first auxiliary electrode positioned between the emitter region and the first electrode and a second auxiliary electrode positioned between the first field region and the second electrode.

The first and second auxiliary electrodes may be formed of a transparent conductive material.

The emitter region and the first field region may be positioned on a surface of the substrate on which light is not incident.

The substrate may be formed of crystalline semiconductor, and the emitter region and the first field region may be formed of non-crystalline semiconductor.

The solar cell may further include a second field region positioned on the substrate to be opposite to the first field region.

The solar cell may further include a passivation layer positioned between the substrate and the second field region.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
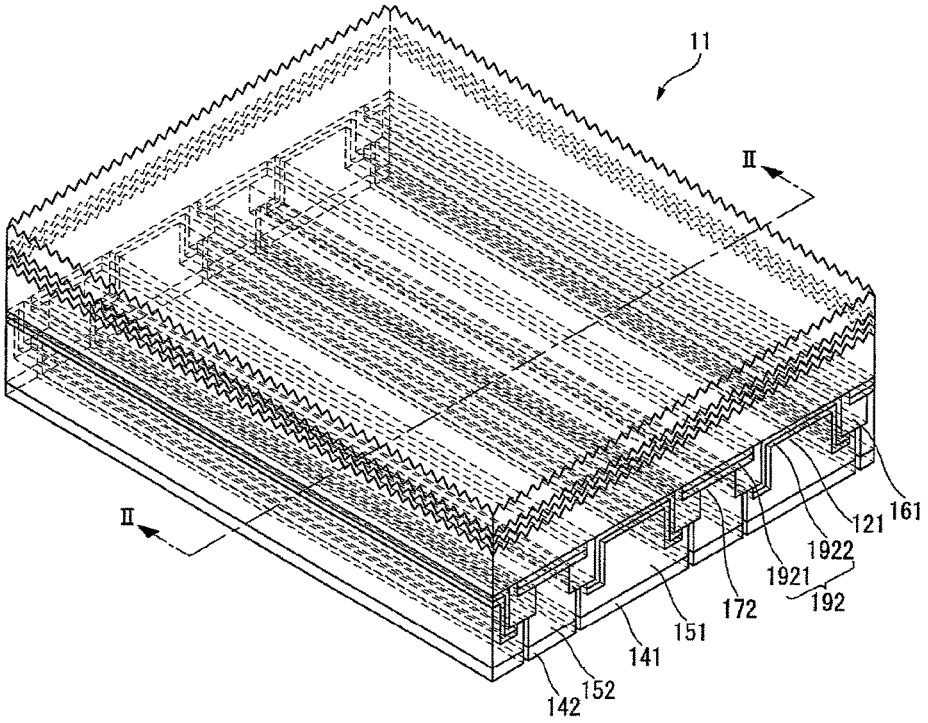
FIG. 1 is a partial perspective view of a solar cell according to an embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

A solar cell according to an embodiment of the invention is described in detail with reference to FIGS. 1 and 2.

FIG. 1 is a partial perspective view of a solar cell according to an embodiment of the invention. FIG. 2 is a cross-sectional view taken along line II-II of FIG. 1.

Figure 2:
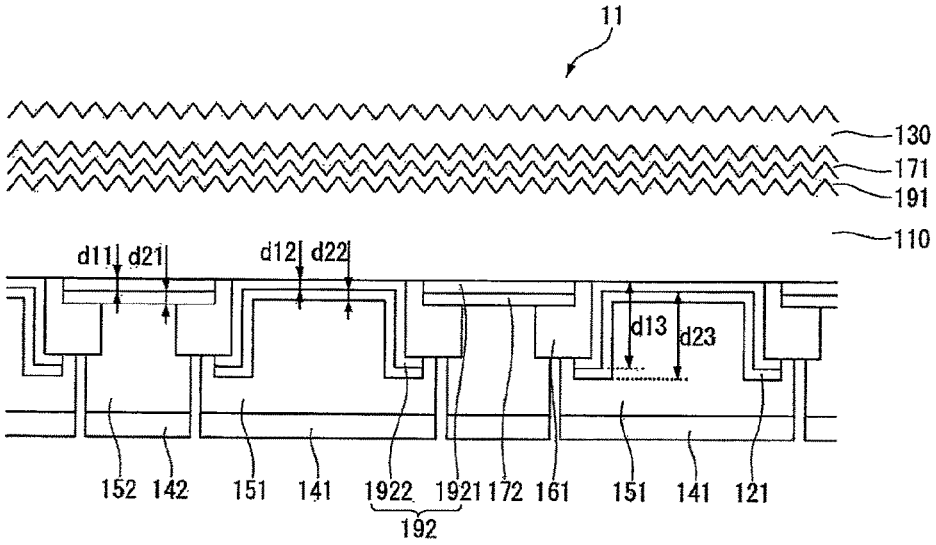
FIG. 2 is a cross-sectional view taken along line II-II of FIG. 1.

As shown in FIGS. 1 and 2, a solar cell 11 according to an embodiment of the invention includes a substrate 110, a front passivation layer 191 positioned on a surface (hereinafter, referred to as "a front surface") of the substrate 110 on which light is incident, a front surface field (FSF) region 171 positioned on the front passivation layer 191, an anti-reflection layer 130 positioned on the FSF region 171, a back passivation layer 192 positioned on a surface (hereinafter, referred to as "a back surface") of the substrate 110, opposite the front surface of the substrate 110, on which the light is not incident, a plurality of emitter regions 121 positioned on a portion of the back passivation layer 192, a plurality of back surface field (BSF) regions 172 that are positioned on a portion of the back passivation layer 192 to be separated from the plurality of emitter regions 121, a plurality of first auxiliary electrodes 151 respectively positioned on the plurality of emitter regions 121, a plurality of second auxiliary electrodes 152 respectively positioned on the plurality of BSF regions 172, a plurality of first electrodes 141 respectively positioned on the plurality of first auxiliary electrodes 151, a plurality of second electrodes 142 respectively positioned on the plurality of second auxiliary electrodes 152, and a plurality of insulating regions 161, each of which is positioned between the emitter region 121 and the BSF region 172 adjacent to each other and on a portion of the BSF region 172.

The substrate 110 is a semiconductor substrate formed of first conductive type silicon, for example, n-type silicon, though not required. Silicon used in the substrate 110 may be crystalline silicon such as single crystal silicon and polycrystalline silicon. When the substrate 110 is of an n-type, the substrate 110 may contain impurities of a group V element such as phosphor (P), arsenic (As), and antimony (Sb). Alternatively, the substrate 110 may be of a p-type, and/or be formed of another semiconductor materials other than silicon. When the substrate 110 is of the p-type, the substrate 110 may contain impurities of a group III element such as boron (B), gallium (Ga), and indium (In).

The front surface of the substrate 110 may be textured to form a textured surface corresponding to an uneven surface or having uneven characteristics.

The front passivation layer 191 on the front surface of the substrate 110 performs a passivation operation that converts unstable bonds, such as a dangling bond, existing on the surface of the substrate 110 and around the surface of the substrate 110 into stable bonds to thereby prevent or reduce a recombination and/or a disappearance of carriers moving to the front surface of the substrate 110 resulting from the unstable bonds. In the present embodiment, because the front passivation layer 191 is formed of intrinsic amorphous silicon (a-Si) in which there is no impurities or impurities scarcely exist, a defect (for example, a loss of carriers) resulting from the impurities is prevented or reduced. Alternatively, the front passivation layer 191 may be formed of silicon oxide (SiOx) and/or silicon nitride (SiNx).

The FSF region 171 on the front passivation layer 191 is formed of amorphous silicon in the present embodiment, but may be formed of crystalline silicon such as polycrystalline silicon. The FSF region 171 is an impurity region (for example, an $n^+$-type region) that is more heavily doped with impurities of the same conductive type as the substrate 110 than the substrate 110.

Accordingly, the movement of holes to the front surface of the substrate 110 is prevented or reduced by a potential barrier resulting from a difference between impurity concentrations of the substrate 110 and the FSF region 171. Hence, a recombination and/or a disappearance of electrons and holes on the surface of the substrate 110 and around the surface of the substrate 110 are prevented or reduced. The FSF region 171 performs the passivation operation in the same manner as the front passivation layer 191, thereby preventing or reducing a recombination and/or a disappearance of carriers on the surface of the substrate 110 and around the surface of the substrate 110.

The anti-reflection layer 130 on the FSF region 171 reduces a reflectance of light incident on the solar cell 11 and increases selectivity of a predetermined wavelength band, thereby increasing the efficiency of the solar cell 11. The anti-reflection layer 130 is formed of SiNx, SiOx, SiNx:H, SiOx:H, etc. In the present embodiment, the anti-reflection layer 130 has a singe-layered structure, but the anti-reflection layer 130 may have a multi-layered structure such as a double-layered structure in other embodiments. The anti-reflection layer 130 may be omitted, if desired. The anti-reflection layer 130 performs the passivation operation in the same manner as the front passivation layer 191.

Accordingly, because a recombination and/or a disappearance of carriers around the front surface of the substrate 110 resulting from the unstable bonds is prevented/or reduced through the passivation operations of the front passivation layer 191, the FSF region 171, and the anti-reflection layer 130 positioned on the front surface of the substrate 110, the efficiency of the solar cell 11 is improved.

The back passivation layer 192 on the back surface of the substrate 110 includes a plurality of first back passivation layers 1921 (i.e., first portions) separated from one another and a plurality of second back passivation layers 1922 (i.e., second portions) separated from one another. The first and second back passivation layers 1921 and 1922 adjacent to each other extend parallel to each other on the substrate 110 in a fixed direction.

Each second back passivation layer 1922 is positioned on a portion of the insulating region 161 adjacent to the second back passivation layer 1922. Hence, each first back passivation layer 1921 has the same height d11 irrespective of its formation location, and each second back passivation layer 1922 has different heights d12 and d13 depending on its formation location. For example, the height (i.e., location) d12 in a middle portion of the second back passivation layer 1922 is less than the height (i.e., location) d13 in both edge portions of the second back passivation layer 1922. The location d11 of the first back passivation layer 1921 and the location d12 of the second back passivation layer 1922 are the same as each other in the present embodiment, but may be different from each other. In the embodiment, the location (i.e., height) indicates a shortest distance between the surface of the substrate 110 and an upper surface of each of the first and second passivation layers 1921 and 1922.

The back passivation layer 192 is formed of amorphous silicon, silicon oxide (SiOx), or silicon nitride (SiNx) in the same manner as the front passivation layer 191. The back passivation layer 192 performs a passivation operation, thereby preventing or reducing a recombination and/or a disappearance of carriers moving to the back surface of the substrate 110 resulting from the unstable bonds.

Each of the first and second back passivation layers 1921 and 1922 has a thickness to the extent that carriers moving to the back surface of the substrate 110 can pass through each of the first and second back passivation layers 1921 and 1922 and can move to the BSF regions 172 and the emitter regions 121. For example, the thickness of the back passivation layer 192 may be approximately 1 nm to 10 nm.

The plurality of BSF regions 172 are positioned on the first back passivation layers 1921 and have the same plane shape as the first back passivation layers 1921. Thus, the BSF regions 172 extend on the first back passivation layers 1921 in a fixed direction along the first back passivation layers 1921. The plurality of BSF regions 172 are formed of amorphous silicon in the same manner as the FSF region 171. Each BSF region 172 is an impurity region (for example, an $n^+$-type region) that is more heavily doped with impurities of the same conductive type as the substrate 110 than the substrate 110. Each BSF region 172 has the same height d21 irrespective of its formation location in the same manner as the first back passivation layer 1921 underlying the BSF region 172. In embodiments of the invention, reference to a plane shape also refers to having a sheet shape, and reference to the same plane shape refers to the same plane shape so that extending directions of the planar surfaces of regions and layers match.

Accordingly, carriers (for example, holes) passing through the plurality of first back passivation layers 1921 are prevented or reduced from moving to the plurality of second electrodes 142 by a potential barrier resulting from a difference between impurity concentrations of the substrate 110 and the BSF regions 172 in the same manner as the FSF region 171. Hence, a recombination and/or a disappearance of electrons and holes around the plurality of second electrodes 142 are prevented or reduced.

The plurality of emitter regions 121 are positioned on the second back passivation layers 1922 of the back passivation layer 192 and have the same plane shape as the second back passivation layers 1922. Thus, the emitter regions 121 extend on the second back passivation layers 1922 in a fixed direction along the second back passivation layers 1922.

As shown in FIGS. 1 and 2, the plurality of emitter regions 121 and the plurality of BSF regions 172 are alternatively positioned on the back surface of the substrate 110.

Each emitter region 121 is of a second conductive type (for example, a p-type) opposite a conductive type of the substrate 110. Each emitter region 121 is formed of a semiconductor (for example, a non-crystalline semiconductor such as amorphous silicon) different from the substrate 110. Thus, the plurality of emitter regions 121 and the substrate 110 form a heterojunction as well as a p-n junction.

Each emitter region 121 has a different height depending on its formation location in the same manner as the second back passivation layer 1922 underlying the emitter region 121. For example, a height d22 in a middle portion of the emitter region 121 is less than a height d23 in both edge portions of the emitter region 121. The height d22 in the middle portion of the emitter region 121 and the height d21 of the BSF region 172 are the same as each other in the present embodiment, but may be different from each other. In the embodiment, the height indicates a shortest distance between the surface of each of the first and second back passivation layers 1921 and 1922 and an upper surface of each of the BSF region 172 and the emitter region 121. The height also may be a shortest distance between the surface of the substrate 110 and the surface of each of the BSF region 172 and the emitter region 121.

When the plurality of emitter regions 121 are of the p-type, the emitter regions 121 may contain impurities of a group III element such as boron (B), gallium (Ga), and indium (In). On the contrary, when the emitter regions 121 are of an n-type, the emitter regions 121 may contain impurities of a group V element such as phosphor (P), arsenic (As), and antimony (Sb).

A plurality of electron-hole pairs produced by light incident on the substrate 110 are separated into electrons and holes by a built-in potential difference resulting from a p-n junction between the substrate 110 and the emitter regions 121. Then, the separated electrons move to the n-type semiconductor, and the separated holes move to the p-type semiconductor. Thus, when the substrate 110 is of the n-type and the emitter regions 121 are of the p-type, the separated holes pass through the second back passivation layers 1922 of the back passivation layer 192 and move to the emitter regions 121 and the separated electrons pass through the first back passivation layers 1921 of the back passivation layer 192 and move to the BSF regions 172 with the high impurity concentration.

Because the substrate 110 and each emitter region 121 form the p-n junction, the emitter region 121 may be of the n-type when the substrate 110 is of the p-type unlike the embodiment described above. In this instance, the separated electrons pass through the second back passivation layers 1922 of the back passivation layer 192 and move to the emitter regions 121, and the separated holes pass through the first back passivation layers 1921 of the back passivation layer 192 and move to the BSF regions 172.

The plurality of emitter regions 121, the plurality of BSF regions 172, and the back passivation layer 192 perform the passivation operation, thereby preventing or reducing a recombination and/or a disappearance of carriers on the back surface of the substrate 110 and around the back surface of the substrate 110 resulting from the unstable bonds. Hence, the efficiency of the solar cell 11 is improved.

Further, in the embodiment, a crystallization phenomenon when the emitter regions 121 and the BSF regions 172 are positioned on the back passivation layer 192 formed of intrinsic a-Si is reduced further than a crystallization phenomenon when the emitter regions 121 and the BSF regions 172 are positioned directly on the substrate 110 formed of a crystalline semiconductor material. Hence, characteristics of the emitter regions 121 and the BSF regions 172 positioned on an amorphous silicon layer (i.e., the back passivation layer 192) are improved.

The plurality of insulating regions 161 are formed of a non-conductive material, for example, a silicon oxide-based material such as SiOx, a-SiOx, SiOx:H, and a-SiOx:H.

Each insulating region 161 long extends on the substrate 110 between the adjacent first and second back passivation layers 1921 and 1922 and on an edge portion of the BSF region 172 on the first back passivation layer 1921 in an extending direction of the emitter regions 121 and the BSF regions 172. Thus, each insulating region 161 overlaps a portion of the BSF region 172. As described above, a portion of each insulating region 161 overlaps a portion of the second back passivation layer 1922 and a portion of the emitter region 121 on the second back passivation layer 1922.

The plurality of insulating regions 161 insulate between the emitter region 121 and the BSF region 172 adjacent to each other, thereby preventing a short-circuit between the emitter region 121 and the BSF region 172, preventing a leakage of carriers, and preventing a loss of carriers resulting from an electrical interference between the emitter region 121 and the BSF region 172 physically separated from each other. Hence, an amount of leak current of the solar cell 11 decreases.

In embodiments of the invention, the second back passivation layers 1922 includes several portions whereby one portion (a first portion) extends parallel to the substrate 110 on the substrate 110, another portion (a second portion) extends along a lateral surface of the insulation region 161, and yet another portion (a third portion) extends parallel on a surface of the insulation region 161 that is parallel to the substrate 110. Also, the emitter region 121 includes several portions whereby one portion (a first portion) extends parallel to the substrate 110, another portion (a second portion) extends parallel to a lateral surface of the insulation region 161, and yet another portion (a third portion) extends parallel to a surface of the insulation region 161 that is parallel to the substrate 110. In other embodiments, one or more portions of the second back passivation layers 1922 need not match the plane shape of corresponding one or more portions of the emitter region 121, and vice-versa.

The plurality of first auxiliary electrodes 151 on the plurality of emitter regions 121 extend along the emitter regions 121 and are electrically connected to the emitter regions 121. Further, as shown in FIGS. 1 and 2, each first auxiliary electrode 151 is positioned on the insulating region 161 adjacent to each emitter region 121. Hence, the first auxiliary electrodes 151 protect the emitter regions 121 underlying the first auxiliary electrodes 151 from oxygen in the air, thereby preventing changes of characteristics of the emitter regions 121 resulting from an oxidation reaction.

As described above, because each emitter region 121 has the different heights d22 and d23 depending on its formation location, each first auxiliary electrode 151 has different thicknesses depending on its formation location. For example, a thickness of the first auxiliary electrode 151 positioned in the middle portion of the emitter region 121 is greater than a thickness of the first auxiliary electrode 151 positioned in the both edge portions of the emitter region 121 and on the insulating region 161.

The plurality of second auxiliary electrodes 152 on the plurality of BSF regions 172 extend along the BSF regions 172 and are electrically connected to the BSF regions 172. Unlike the first auxiliary electrodes 151, each second auxiliary electrode 152 has a uniform thickness, or essentially a uniform thickness except for small portions at edges.

Similar to the emitter regions 121, the second auxiliary electrodes 152 and the insulating regions 161 protect the BSF regions 172 from oxygen in the air, thereby preventing changes of characteristics of the BSF regions 172 resulting from an oxidation reaction.

The plurality of first and second auxiliary electrodes 151 and 152 are formed of a transparent conductive material with conductivity. Examples of the transparent conductive material include ITO, ZnO, $SnO_2$, TCO, etc., or a combination thereof, or a material obtained by doping these materials or the combination with aluminum (Al), germanium (Ge), gallium (Ga), ferrum (Fe), etc.

The plurality of first and second auxiliary electrodes 151 and 152 respectively transfer carriers, for example, holes and electrons respectively moving to the emitter regions 121 and the BSF regions 172 and reflects light passing through the substrate 110 and the back passivation layer 192 to the substrate 110, thereby serving as a reflector increasing an amount of light incident on the substrate 110.

An amount of carriers existing in the middle portion of the emitter region 121 is more than an amount of carriers existing in the both edge portions of the emitter region 121. Thus, in the embodiment, because a thickness of a middle portion of the first auxiliary electrode 151 is greater than a thickness of an edge portion of the first auxiliary electrode 151, an amount of carriers transferred to the first auxiliary electrode 151 corresponding to the emitter region 121 increase. Alternatively, the plurality of first and second auxiliary electrodes 151 and 152 may be omitted.

The plurality of first electrodes 141 on the plurality of first auxiliary electrodes 151 long extend along the first auxiliary electrodes 151 and are electrically and physically connected to the first auxiliary electrodes 151. The first electrode 141 and the first auxiliary electrode 151 underlying the first electrode 141 have the same plane shape in FIGS. 1 and 2, but may have different plane shapes.

Each first electrode 141 collects carriers (for example, holes) that move to the corresponding emitter region 121 and are transferred through the first auxiliary electrode 151. Because the first auxiliary electrode 151 has the different thicknesses depending on its formation location as described above, a carrier collection efficiency from the emitter region 121 to the corresponding first auxiliary electrode 151 is improved. Hence, an amount of carriers output to the first electrode 141 increases.

The plurality of second electrodes 142 on the plurality of second auxiliary electrodes 152 long extend along the second auxiliary electrodes 152 and are electrically and physically connected to the second auxiliary electrodes 152. The second electrode 142 and the second auxiliary electrode 152 underlying the second electrode 142 have the same plane shape in FIGS. 1 and 2, but may have different plane shapes. Each second electrode 142 collects carriers (for example, electrons) that move to the corresponding BSF region 172 and are transferred through the second auxiliary electrode 152.

The plurality of first and second electrodes 141 and 142 may be formed of at least one conductive material selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

In the embodiment, the plurality of first and second auxiliary electrodes 151 and 152 formed of the transparent conductive material exist between the plurality of emitter regions 121 and the plurality of BSF regions 172 formed of a semiconductor material such as amorphous silicon and the plurality of first and second electrodes 141 and 142 formed of a metal material, thereby improving an adhesive strength between the semiconductor material with a low adhesive strength (adhesive characteristic) and the metal material. Hence, an adhesive strength between the emitter regions 121 and the first electrodes 141 and an adhesive strength between the BSF regions 172 and the second electrodes 142 are improved.

Further, an ohmic contact is formed between the emitter regions 121 and the first electrodes 141 and between the BSF regions 172 and the second electrodes 142, thereby improving the conductivity between the emitter regions 121 and the first electrodes 141 and the conductivity between the BSF regions 172 and the second electrodes 142. Hence, the carrier transfer efficiency of the first and second electrodes 141 and 142 increases.

If the plurality of first and second auxiliary electrodes 151 and 152 are omitted, each first electrode 141 and each second electrode 142 are directly positioned on the corresponding emitter region 121 and the corresponding BSF region 172, respectively.

The solar cell 11 having the above-described structure is a solar cell in which the plurality of first and second electrodes 141 and 142 are positioned on the back surface of the substrate 110, on which light is not incident, and the substrate 110 and the emitter regions 121 are formed of different kinds of semiconductors. An operation of the solar cell 11 is described below.

When light is irradiated onto the solar cell 11, sequentially passes through the anti-reflection layer 130, the FSF region 171, and the front passivation layer 191, and is incident on the substrate 110, a plurality of electron-hole pairs are generated in the substrate 110 by light energy based on the incident light. In this instance, because the surface of the substrate 110 is the textured surface, a light reflectance in the front surface of the substrate 110 is reduced. Further, because both a light incident operation and a light reflection operation are performed on the textured surface of the substrate 110, absorption of light increases and the efficiency of the solar cell 11 is improved. In addition, because a reflection loss of the light incident on the substrate 110 is reduced by the anti-reflection layer 130, an amount of light incident on the substrate 110 further increases.

The electron-hole pairs are separated into electrons and holes by the p-n junction of the substrate 110 and the emitter regions 121, and the separated holes move to the p-type emitter regions 121 and the separated electrons move to the n-type BSF regions 172. The holes moving to the p-type emitter regions 121 are collected by the first electrodes 141 through the first auxiliary electrodes 151, and the electrons moving to the n-type BSF regions 172 are collected by the second electrodes 142 through the second auxiliary electrodes 152. When the first electrodes 141 and the second electrodes 142 are connected to each other using electric wires, current flows therein to thereby enable use of the current for electric power.

Further, because the passivation layers 192 and 191 are positioned on the front surface as well as the back surface of the substrate 110, a recombination and/or a disappearance of carriers on the front and back surfaces of the substrate 110 and around the front and back surfaces of the substrate 110 resulting from the unstable bonds are prevented or reduced. Hence, the efficiency of the solar cell 11 is improved.

Further, because the BSF regions 172 and FSF regions 171, that are heavily doped with impurities of the same conductive type as the substrate 110, are positioned on the front surface as well as the back surface of the substrate 110, a movement of holes to the front and back surfaces of the substrate 110 is prevented or reduced. Hence, a recombination and/or a disappearance of electrons and holes around the front and back surfaces of the substrate 110 resulting from the unstable bonds are prevented or reduced, and the efficiency of the solar cell 11 is improved.

In addition, because the adhesive characteristics between the emitter regions 121 and the BSF regions 172 and the first and second electrodes 141 and 142 are improved by the first and second auxiliary electrodes 151 and 152, the efficiency of the solar cell 11 is further improved.

Because a gap between the emitter region 121 and the BSF region 172 adjacent to each other is filled with the insulating region 161, an electrical insulating state is maintained between the emitter region 121 and the BSF region 172. Hence, the short-circuit between the emitter region 121 and the BSF region 172 adjacent to each other is prevented, and thus a flow of carriers in an unwanted direction is prevented. Further, an electrical interference between the emitter region 121 and the BSF region 172 adjacent to each other is prevented, and thus a loss amount of carrier is reduced. As a result, the efficiency of the solar cell 11 is further improved.

Furthermore, because the thickness of the middle portion of the first auxiliary electrode 151 contacting the middle portion of each emitter region 121 having a high carrier density is greater than the thickness of the edge portion of the first auxiliary electrode 151, the carrier transfer efficiency is improved. Hence, the efficiency of the solar cell 11 is further improved.

A method for manufacturing the solar cell 11 according to the embodiment of the invention is described below with reference to FIGS. 3A to 3T and FIGS. 4A and 4B.

Figure 3A:
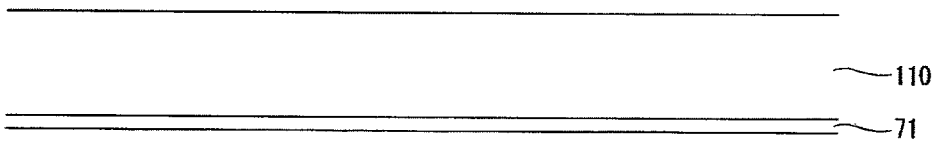
FIGS. 3A to 3T sequentially illustrate each of stages in a method for manufacturing the solar cell shown in FIG. 1.
Figure 3B:
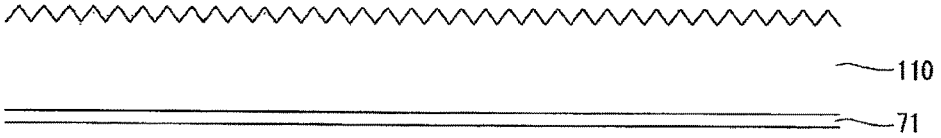
Figure 3C:
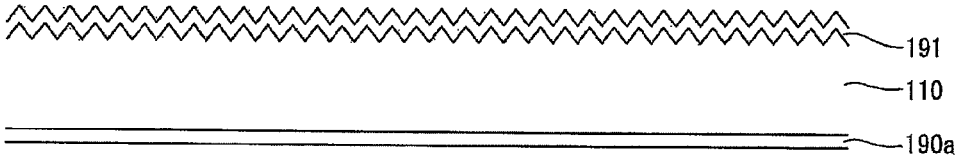
Figure 3D:
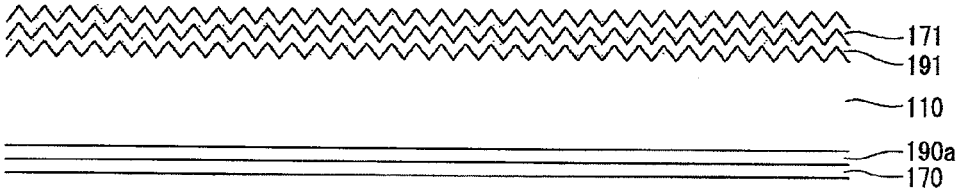
Figure 3E:
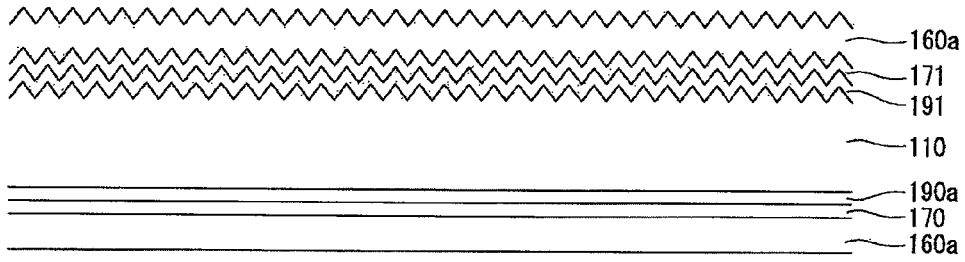
Figure 3F:
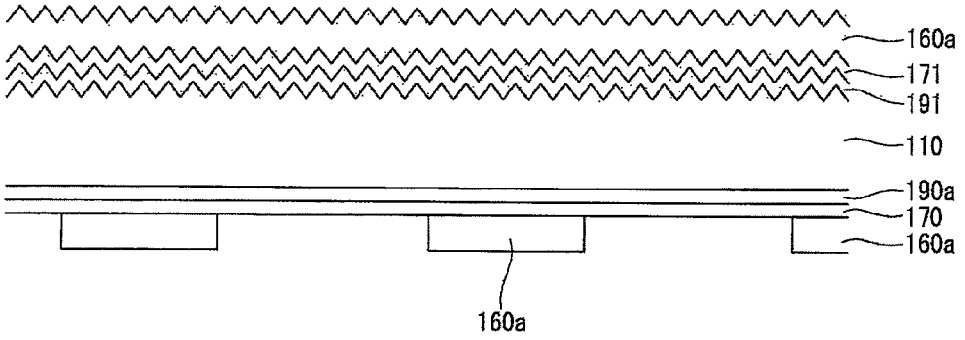
Figure 3G:
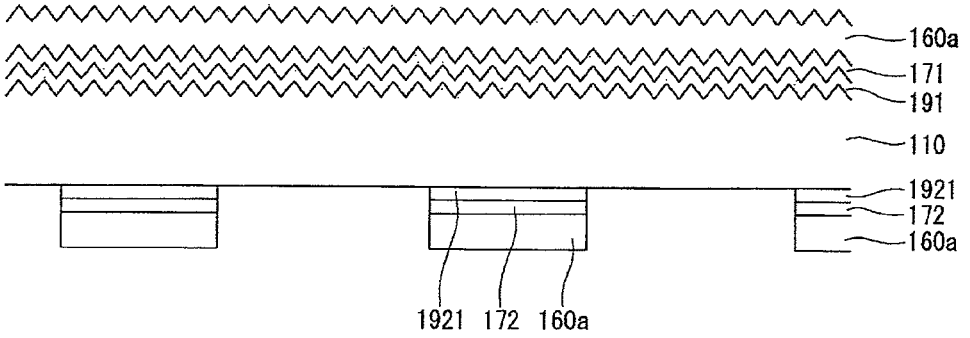
Figure 3H:
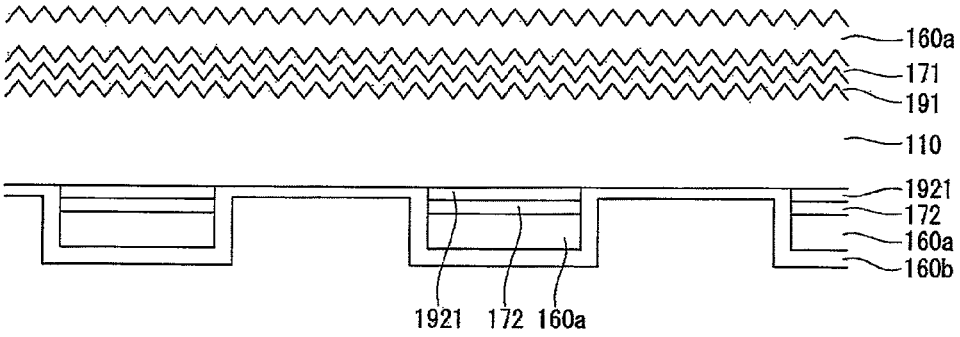
Figure 3I:
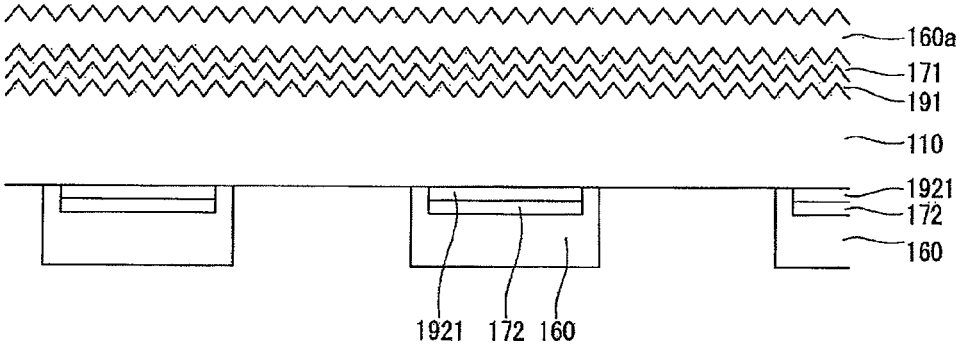
Figure 3J:
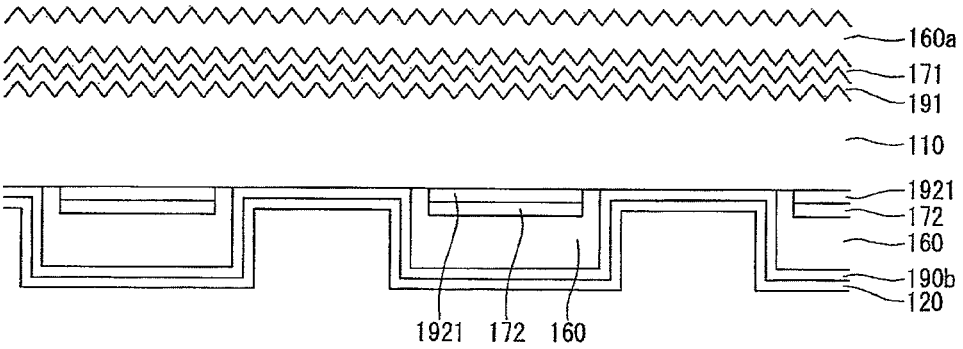
Figure 3K:
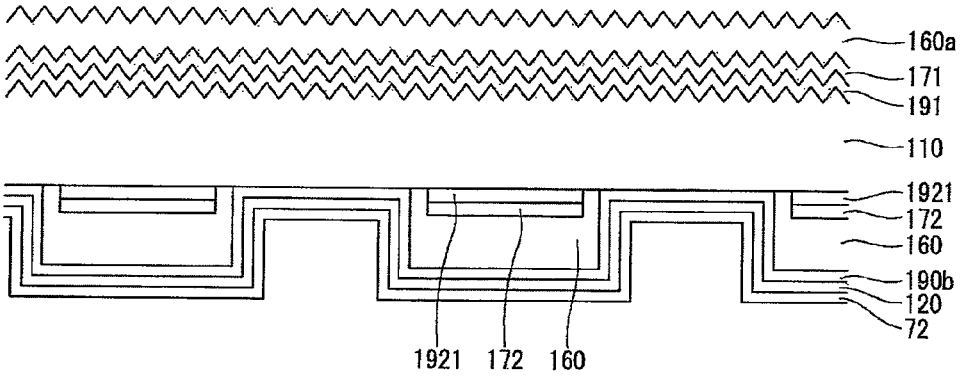
Figure 3L:
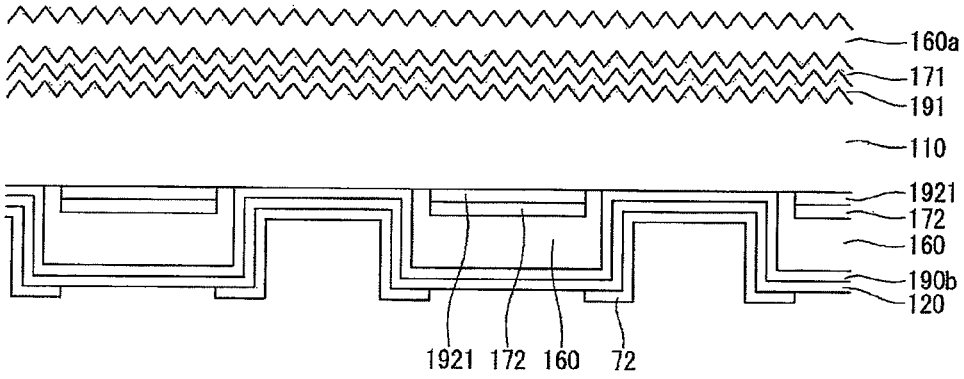
Figure 3M:
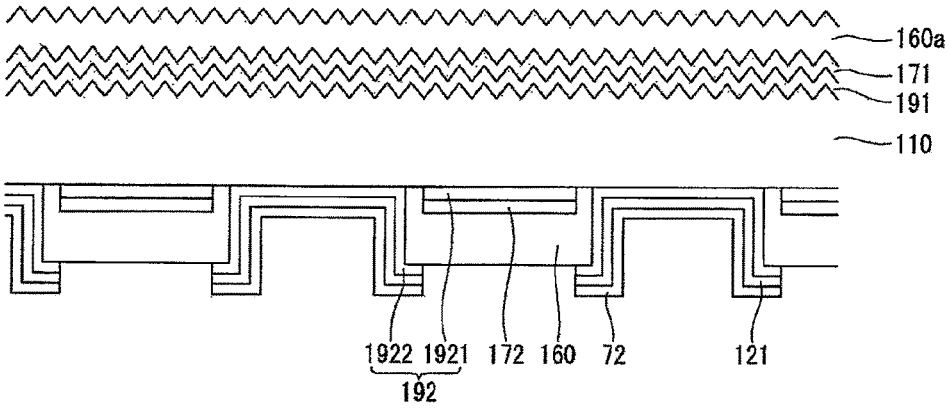
Figure 3N:
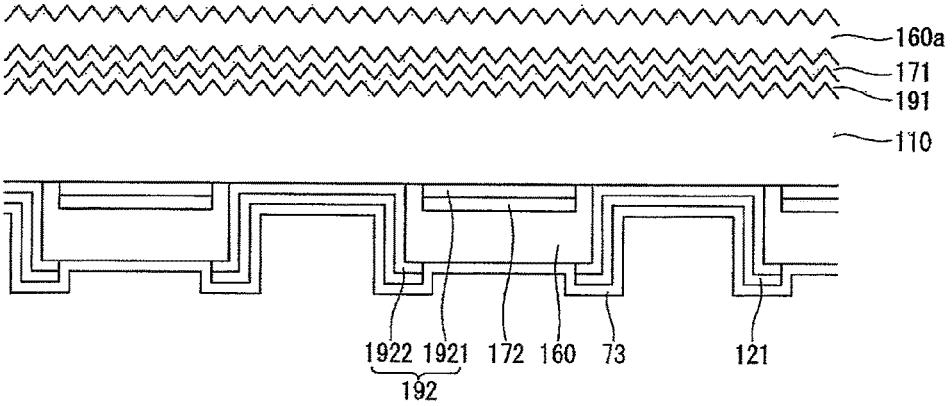
Figure 3O:
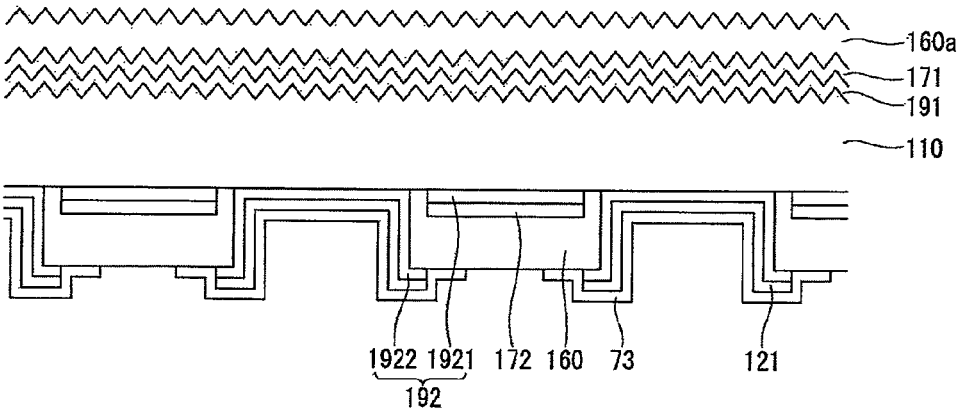
Figure 3P:
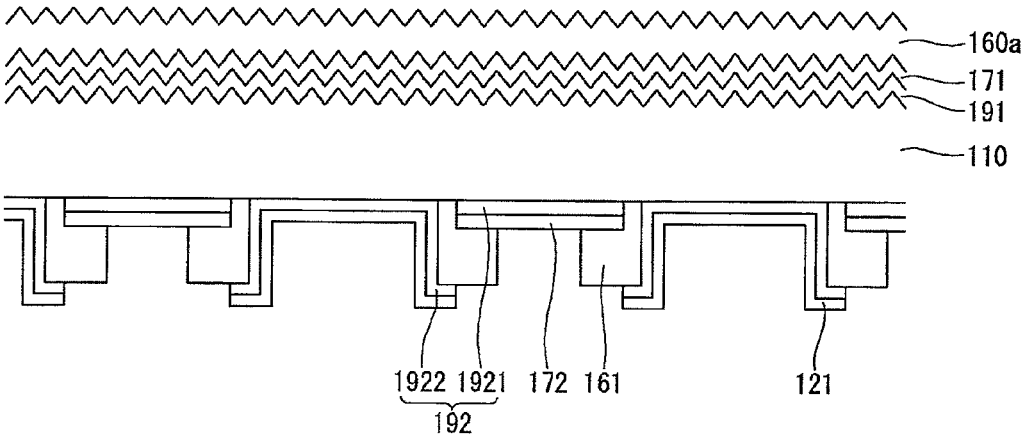
Figure 3Q:
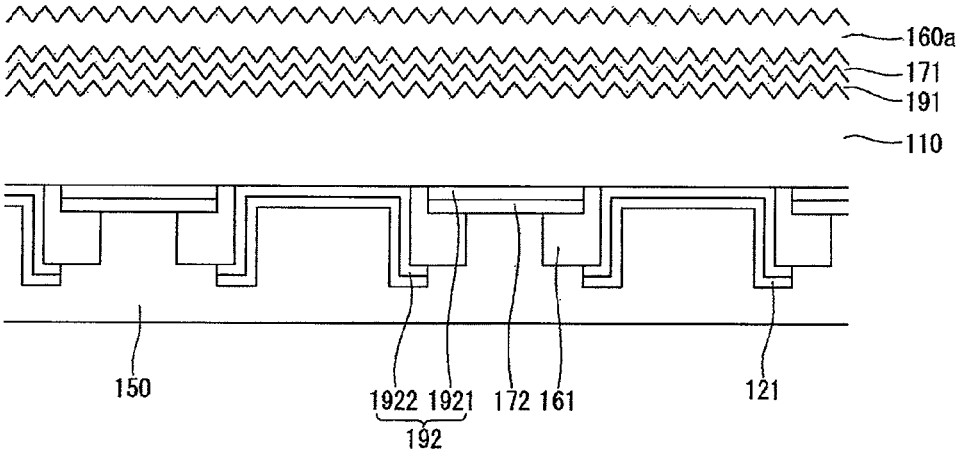
Figure 3R:
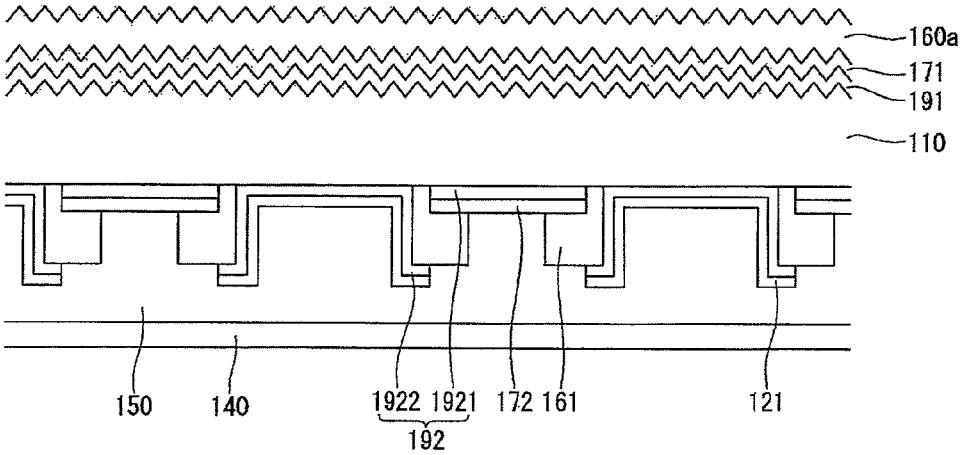
Figure 3S:
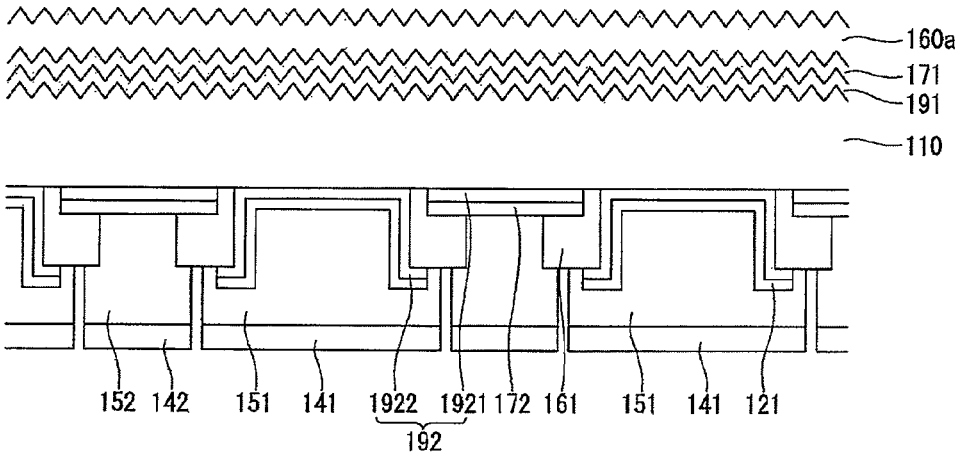
Figure 3T:
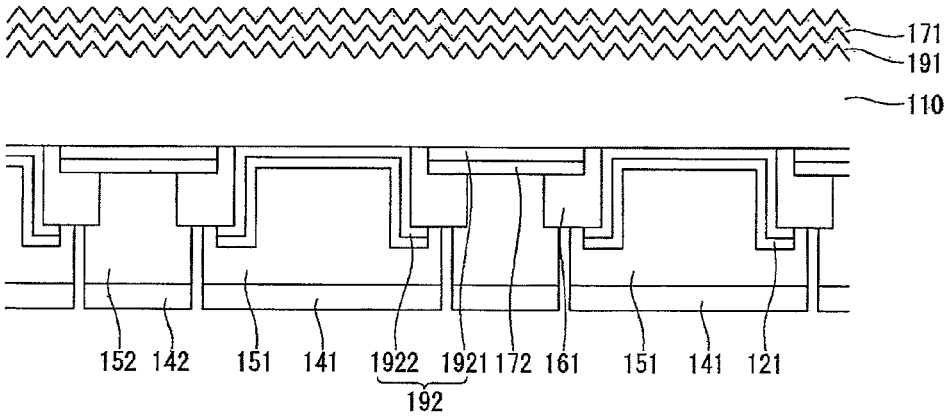
Figure 4A:
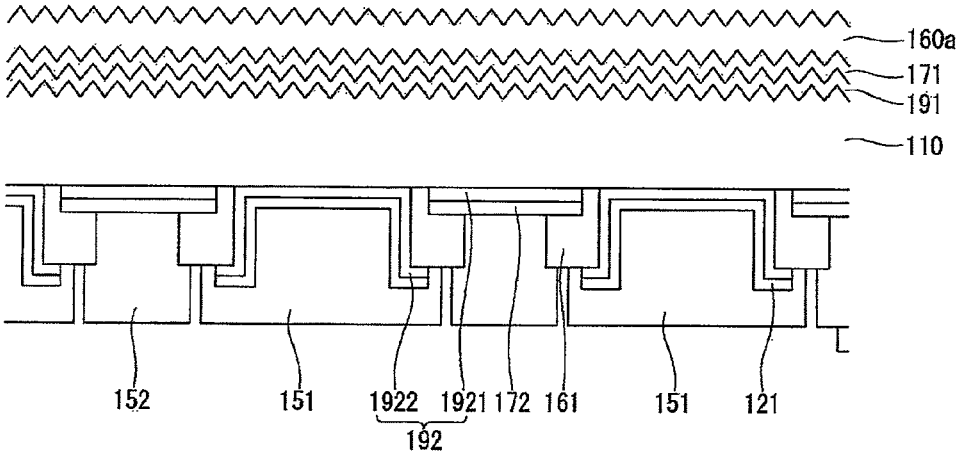
FIGS. 4A and 4B illustrate another method for manufacturing a plurality of first and second auxiliary electrodes and a plurality of first and second electrodes in a method for manufacturing the solar cell shown in FIG. 1.
Figure 4B:
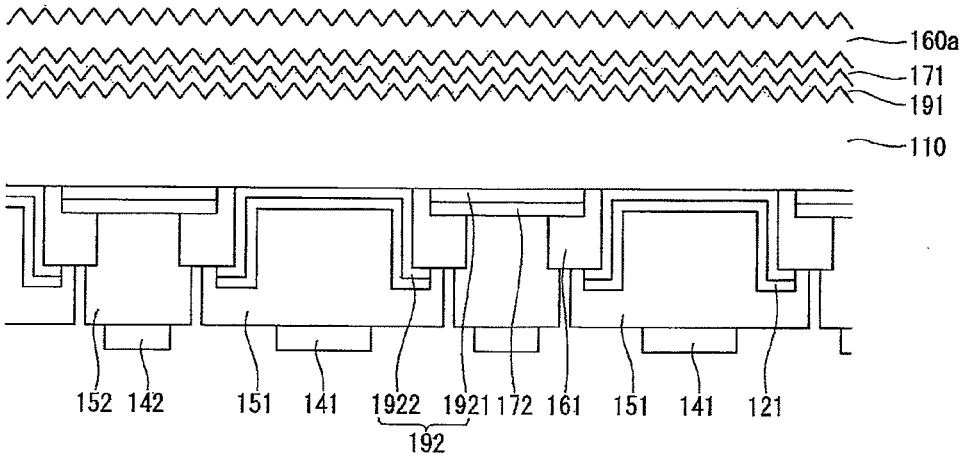

FIGS. 3A to 3T sequentially illustrate each of stages in a method for manufacturing the solar cell 11 according to the embodiment of the invention. FIGS. 4A and 4B illustrate another method for manufacturing the plurality of first and second auxiliary electrodes and the plurality of first and second electrodes in a method for manufacturing the solar cell 11 according to the embodiment of the invention.

As shown in FIG. 3A, an etch stop layer 71 formed of silicon oxide (SiOx), etc. is stacked on the back surface of the substrate 110 formed of n-type polycrystalline silicon.

Next, as shown in FIG. 3B, an etching process is performed on the front surface of the substrate 110, on which the etch stop layer 71 is not formed, using the etch stop layer 71 as a mask, to form a textured surface on the front surface of the substrate 110. The etch stop layer 71 is then removed. Alternatively, only the surface of the substrate 110 to be etched is exposed to an etchant without forming the separate etch stop layer 71. Hence, the textured surface may be formed on the desired surface of the substrate 110.

Next, as shown in FIG. 3C, the front passivation layer 191 and a first back passivation layer 190a, that are formed of intrinsic amorphous silicon, are formed on the front surface (i.e., the textured surface) and the back surface of the substrate 110 using a deposition method such as a plasma enhanced chemical vapor deposition (PECVD) method. In this instance, the front passivation layer 191 and the first back passivation layer 190a formed of the same material are respectively formed on the front and back surfaces of the substrate 110 by changing a location of the surface of the substrate 110 exposed to a deposition material. A formation order of the front passivation layer 191 and the first back passivation layer 190a may vary.

Next, as shown in FIG. 3D, an amorphous silicon layer $n^+$-α-Si, that is formed of amorphous silicon and is more heavily doped with impurities of a group V element than the substrate 110, is formed on the front passivation layer 191 and the first back passivation layer 190a using the PECVD method, etc. Hence, the FSF region 171 and a BSF layer 170 are formed.

For example, because $POCl_3$ is injected into a chamber, the FSF region 171 and the BSF layer 170, that have the same conductivity type as the substrate 110 and have an impurity concentration higher than the substrate 110, may be formed.

As described above, the FSF region 171 and the BSF layer 170 formed of the same material are respectively formed on the front and back surfaces of the substrate 110 by changing a location of the surface of the substrate 110 exposed to the deposition material. A formation order of the FSF region 171 and the BSF layer 170 may vary.

Next, as shown in FIG. 3E, a first insulating layer 160a is formed on the FSF region 171 of the front surface of the substrate 110 and the BSF layer 170 of the back surface of the substrate 110 using the PECVD method, etc. The first insulating layer 160a may be formed of a silicon oxide-based material such as SiOx, a-SiOx, SiOx:H, and a-SiOx:H. A formation order of the first insulating layers 160a on the front and back surfaces of the substrate 110 may vary.

Next, as shown in FIG. 3F, a portion of the first insulating layer 160a on the back surface of the substrate 110 is removed using an etching process, for example, a photolithographic etching process or a wet process. Then, as shown in FIG. 3G, an exposed portion of the BSF layer 170 and the first back passivation layer 190a underlying the exposed portion of the BSF layer 170 are removed in turn using the remaining first insulating layer 160a as a mask. In this instance, the exposed portion of the BSF layer 170 and the first back passivation layer 190a underlying the exposed portion of the BSF layer 170 are removed using an etching process such as a dry method and a wet method. Hence, the plurality of BSF region 172 and the plurality of first back passivation layers 1921 are formed.

Next, as shown in FIG. 3H, a second insulating layer 160b is formed on the first insulating layer 160a on the back surface of the substrate 110 and an exposed portion of the back surface of the substrate 110 using the PECVD method, etc. In this instance, the second insulating layer 160b is formed of the same material as the first insulating layer 160a and has a thickness less than the first insulating layer 160a.

Next, as shown in FIG. 3I, a portion of the second insulating layer 160b between the adjacent BSF regions 172 is removed using the photolithographic etching process or another etching process. Namely, a portion of the second insulating layer 160b positioned on the back surface of the substrate 110 is removed to expose a portion of the back surface of the substrate 110, so as to form the emitter region and the insulating region on the back surface of the substrate 110. Hence, the remaining second insulating layer 160b and the first insulating layer 160a underlying the remaining second insulating layer 160b form an insulating layer 160.

Next, as shown in FIG. 3J, a second back passivation layer 190b and an emitter layer 120 are formed on the back surface of the substrate 110 using the PECVD method, etc. In this instance, the second back passivation layer 190b is formed of the same material (i.e., intrinsic amorphous silicon) as the first back passivation layer 1921, and the emitter layer 120 is formed of amorphous silicon of a conductivity type (for example, a p-type) opposite the conductivity type of the substrate 110.

Next, as shown in FIG. 3K, an etch stop layer 72 is formed on the emitter layer 120 using the PECVD method, etc. In this instance, the etch stop layer 72 may be formed of the same material as or a material different from the insulating layer 160.

Next, as shown in FIG. 3L, a portion of the etch stop layer 72 is removed to expose a portion of the emitter layer 120 on the insulating layer 160. As shown in FIG. 3M, the exposed portion of the emitter layer 120 and the second back passivation layer 190b underlying the exposed portion of the emitter layer 120 are removed using the remaining etch stop layer 72 as a mask. Hence, the plurality of second back passivation layers 1922 and the plurality of emitter regions 121 are formed. Then, the remaining etch stop layer 72 is removed. When the etch stop layer 72 is formed of the same material as the insulating layer 160, the etch stop layer 72 positioned on the plurality of emitter regions 121 may be removed by controlling an etching time. In this instance, the thickness of the exposed insulating layer 160 decreases. Further, when the etch stop layer 72 is formed of a material different from the insulating layer 160, only the etch stop layer 72 positioned on the plurality of emitter regions 121 is removed using an etchant, etc., and the exposed insulating layer 160 is protected from the etching process and is not removed.

Next, as shown in FIG. 3N, an etch stop layer 73 is formed on the insulating layer 160 and the emitter regions 121 positioned on the back surface of the substrate 110. Then, as shown in FIG. 3O, a portion of the etch stop layer 73 is removed to expose a portion of the insulating layer 160.

Next, as shown in FIG. 3P, the exposed insulating layer 160 is removed using the remaining etch stop layer 73 as a mask. The plurality of insulating regions 161 are positioned on the substrate 110 exposed between the adjacent first and second back passivation layers 1921 and 1922 and between the BSF region 172 and the emitter region 121 adjacent to each other. The remaining etch stop layer 73 is removed.

Next, as shown in FIGS. 3Q and 3R, a transparent conductive layer 150 and a conductive layer 140 are sequentially formed on the entire back surface of the substrate 110 using the PECVD method, etc. Then, a portion of the conductive layer 140 and a portion of the transparent conductive layer 150 are sequentially removed using a wet etching method, etc. Hence, as shown in FIG. 3S, the plurality of first and second electrodes 141 and 142 and the plurality of first and second auxiliary electrodes 151 and 152 are formed.

In this instance, the plurality of emitter regions 121 are completely covered by the plurality of first auxiliary electrodes 151, and the plurality of BSF regions 172 are completely covered by the plurality of second auxiliary electrodes 152 and the plurality of insulating regions 161. Thus, because the emitter regions 121 and the BSF regions 172 are completely protected from oxygen or moisture, changes of the characteristics of the emitter regions 121 and the BSF regions 172 resulting from the oxygen or the moisture are prevented.

Further, as shown in FIGS. 4A and 4B, the plurality of first and second electrodes 141 and 142 and the plurality of first and second auxiliary electrodes 151 and 152 may be formed using another method.

In other words, as shown in FIG. 3Q, the plurality of insulating regions 161 are formed, and then the transparent conductive layer 150 is formed on the entire back surface of the substrate 110 using the PECVD method, etc. Afterwards, as shown in FIG. 4A, a portion of the transparent conductive layer 150 is removed through the wet etching process. Hence, the plurality of first auxiliary electrodes 151 connected to the plurality of emitter regions 121 and the plurality of second auxiliary electrodes 152 connected to the plurality of BSF regions 172 are formed.

Next, as shown in FIG. 4B, an electrode paste is applied on the plurality of first and second auxiliary electrodes 151 and 152 using a screen printing method, and then a thermal process is performed on the electrode paste. Hence, the plurality of first electrodes 141 long extending along the plurality of first auxiliary electrodes 151 and the plurality of second electrodes 142 long extending along the plurality of second auxiliary electrodes 152 are formed. In this instance, the electrode paste contains a conductive material such as aluminum (Al).

In this instance, because the plurality of first and second auxiliary electrodes 151 and 152 and the plurality of first and second electrodes 141 and 142 are formed through separate processes, the first and second electrodes 141 and 142 may be positioned on portions of the first and second auxiliary electrodes 151 and 152 as shown in FIG. 4B. Alternatively, the first and second electrodes 141 and 142 may be positioned on the entire surfaces of the first and second auxiliary electrodes 151 and 152.

Next, as shown in FIG. 3T, the first insulating layer 160a on the front surface of the substrate 110 is removed, and then the anti-reflection layer 130 is formed on the front surface of the substrate 110. Hence, the solar cell 11 shown in FIGS. 1 and 2 is completed. The first insulating layer 160a on the front surface of the substrate 110 protects the front passivation layer 191 and the FSF region 171 from the processes performed on the back surface of the substrate 110.

The anti-reflection layer 130 may be formed using a method (for example, a sputtering method) performed at a low temperature, so as to protect the components formed on the back surface of the substrate 110. Other methods such as the PECVD method may be used.

A solar cell according to an another embodiment of the invention is described below with reference to FIG. 5.

Figure 5:
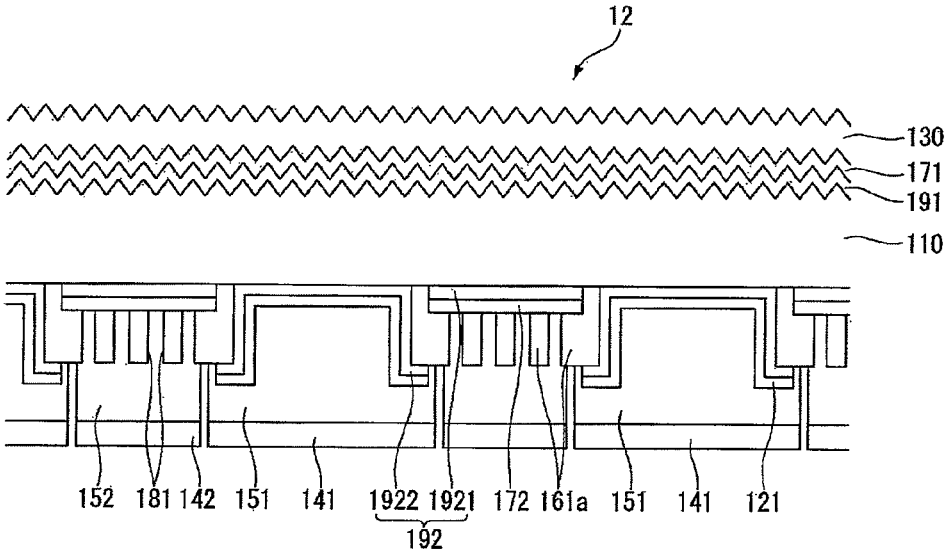
FIG. 5 is a partial cross-sectional view of a solar cell according to another embodiment of the invention.

FIG. 5 is a partial cross-sectional view of a solar cell according to another embodiment of the invention. In the following description, structures and components identical or equivalent to those illustrated in FIGS. 1 to 4B are designated with the same reference numerals, and a further description may be briefly made or may be entirely omitted.

A solar cell 12 shown in FIG. 5 has the same structure as the solar cell 11 shown in FIGS. 1 and 2 except a formation location of a plurality of insulating regions 161a.

More specifically, the solar cell 12 includes a front passivation layer 191, a FSF region 171, and an anti-reflection layer 130 that are sequentially positioned on a front surface of a substrate 110, a back passivation layer 192 positioned on a back surface of a substrate 110, a plurality of emitter regions 121 and a plurality of BSF regions 172 positioned on the back passivation layer 192, a plurality of first and second auxiliary electrodes 151 and 152 positioned on the plurality of emitter regions 121 and the plurality of BSF regions 172, a plurality of first and second electrodes 141 and 142 positioned on the plurality of first and second auxiliary electrodes 151 and 152, and a plurality of insulating regions 161a positioned between the emitter region 121 and the BSF region 172 adjacent to each other.

The plurality of insulating regions 161a are positioned on the substrate 110 between the adjacent first and second back passivation layers 1921 and 1922, between the emitter region 121 and the BSF region 172 adjacent to each other, and between the adjacent BSF regions 172 in the same manner as FIGS. 1 and 2.

However, unlike FIGS. 1 and 2, each insulating region 161a is overall formed on each BSF region 172 and has a plurality of openings 181 exposing a portion of each BSF region 172. Each opening 181 may have a stripe shape long extending along the BSF region 172 or an island shape separated from one another. When each opening 181 has the island shape, each opening 181 may have cross sectional shape of a circle, an oval, or a polygon such as a rectangle.

In other words, the insulating region 161a is formed on substantially the entire surface of the BSF region 172 except a portion of the BSF region 172 exposed by the plurality of openings 181.

Accordingly, the second auxiliary electrode 152 connected to the BSF region 172 exists on the insulating region 161a positioned on the BSF region 172 as well as the portion of the BSF region 172 exposed by the openings 181. Hence, the second auxiliary electrode 152 is connected to the portion of the BSF region 172 exposed by the openings 181. In other words, the second auxiliary electrodes 152 are electrically and physically connected to the portion of the BSF regions 172.

The above-described solar cell 12 has the same effect as the solar cell 11. For example, because the insulating region 161a is formed between the emitter region 121 and the BSF region 172 adjacent to each other, an electrical insulation is provided between the emitter region 121 and the BSF region 172. Hence, the short-circuit and the electrical interference between the emitter region 121 and the BSF region 172 adjacent to each other are prevented. As a result, the efficiency of the solar cell 12 is improved.

Further, because the insulating region 161a is overall formed on the BSF region 172, a formation area of the insulating region 161a increases compared with FIGS. 1 and 2. Namely, a passivation effect increases because of an increase in the formation area of the insulating region 161a. Further, because a thickness of each of the BSF region 172 and the first back passivation layer 1921 underlying the insulating region 161a may decrease, the manufacturing time and the manufacturing cost of the solar cell 12 are reduced.

A method for manufacturing the solar cell 12 according to the embodiment of the invention is described below with reference to FIGS. 3A to 3T, FIGS. 4A and 4B, and FIGS. 6A and 6B.

Figure 6A:
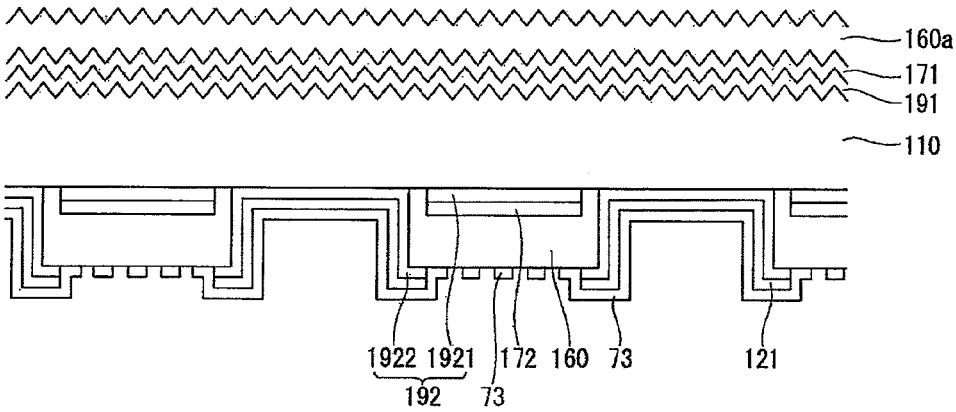
FIGS. 6A and 6B illustrate a portion of a method for manufacturing the solar cell shown in FIG. 5.
Figure 6B:
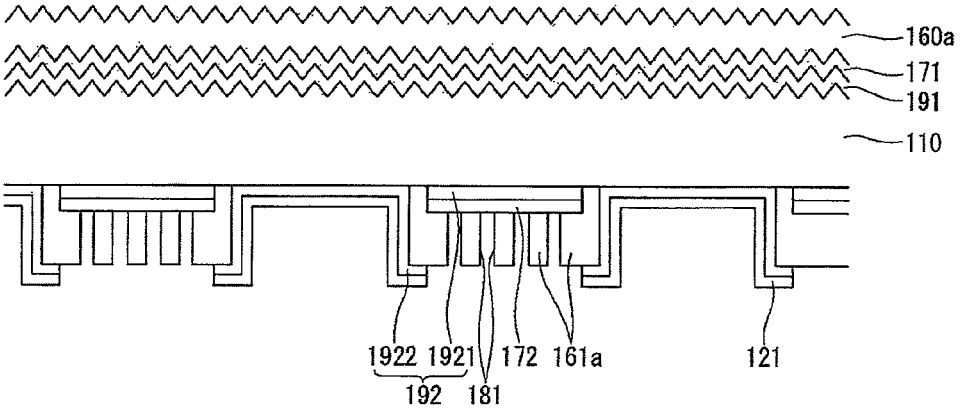

FIGS. 6A and 6B illustrate a portion of a method for manufacturing the solar cell 12 shown in FIG. 5.

As shown in FIGS. 3A to 3M, the textured surface is formed on the surface of the substrate 110, and then the front passivation layer 191 and the plurality of first back passivation layers 1921 are respectively formed on the front and back surfaces of the substrate 110. The FSF region 171 and the plurality of BSF regions 172 are respectively formed on the front passivation layer 191 and the first back passivation layers 1921. Then, the plurality of second back passivation layers 1922 and the plurality of emitter regions 121 are formed.

Next, as shown in FIG. 3N, an etch stop layer 73 is formed on the entire back surface of the substrate 110. Then, as shown in FIG. 6A, the etch stop layer 73 is patterned in a pattern different from a pattern shown in FIG. 3O, so that the insulating layer 160 is partially or selectively exposed. Next, as shown in FIG. 6B, a portion of the exposed insulating layer 160 is removed to form the insulating region 161a having the plurality of openings 181. The etch stop layer 73 is then removed.

Since the subsequent processes are substantially the same as those illustrated in FIGS. 3Q to 3T or FIGS. 4A and 4B, a further description may be briefly made or may be entirely omitted.

A solar cell according to another embodiment of the invention is described below with reference to FIG. 7.

Figure 7:
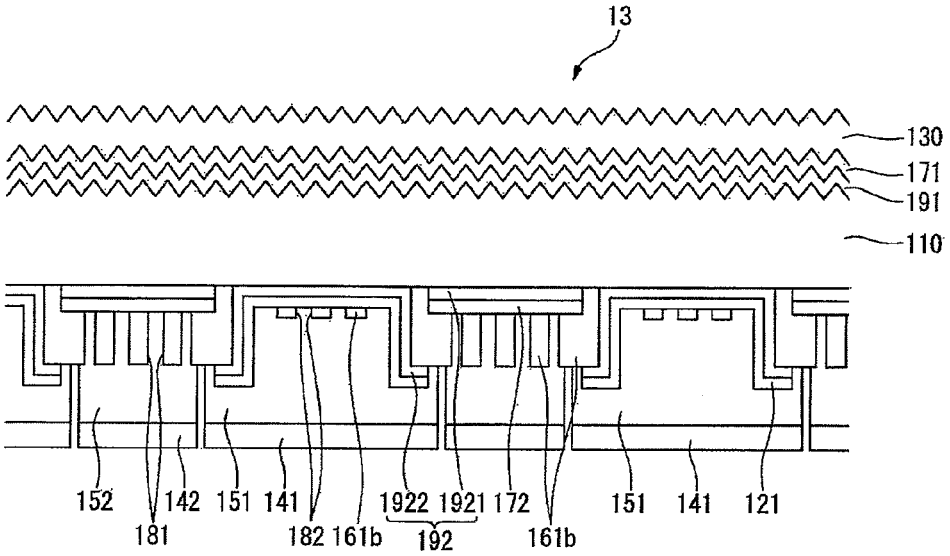
FIG. 7 is a partial cross-sectional view of a solar cell according to another embodiment of the invention.

FIG. 7 is a partial cross-sectional view of a solar cell according to another embodiment of the invention.

A solar cell 13 shown in FIG. 7 has the same structure as the solar cell 12 shown in FIG. 5 except a formation location of a plurality of insulating regions 161b.

More specifically, the plurality of insulating regions 161b of the solar cell 13 are positioned on the substrate 110 between the adjacent first and second back passivation layers 1921 and 1922, between the emitter region 121 and the BSF region 172 adjacent to each other, and on the adjacent BSF regions 172. Further, the plurality of insulating regions 161b are partially positioned on the plurality of emitter regions 121.

The insulating region 161b on each emitter region 121 is mostly positioned in a middle portion of each emitter region 121. Thus, the insulating region 161b includes a plurality of openings 181 exposing a portion of the BSF region 172 and a plurality of openings 182 exposing a portion of the emitter region 121. Each opening 182 may have a stripe shape or an island shape in the same manner as the opening 181.

Accordingly, the first auxiliary electrode 151 is positioned on an exposed portion of the corresponding emitter region 121 and on the insulating region 161b positioned on the corresponding emitter region 121. The second auxiliary electrode 152 is positioned on an exposed portion of the corresponding BSF region 172 and on the insulating region 161b positioned on the corresponding BSF region 172. As described above, the first auxiliary electrodes 151 and the second auxiliary electrode 152 are separated from each other.

Unlike FIG. 5, because the insulating region 161b is positioned on a portion of the emitter region 121, a passivation effect further increases because of the insulating region 161b. Further, because a thickness of each of the emitter region 121 and the second back passivation layer 1922 as well as a thickness of each of the BSF region 172 and the first back passivation layer 1921 underlying the insulating region 161b may decrease, the manufacturing time and the manufacturing cost of the solar cell 13 are further reduced. Further, an open voltage of the solar cell 13 increases because of an increase in the passivation effect, and a resistance of the solar cell 13 decreases because of a reduction in the thickness of the emitter region 121 underlying the insulating region 161b. Hence, a fill factor of the solar cell 12 increases, and the efficiency of the solar cell 12 is further improved.

A method for manufacturing the solar cell 13 according to the embodiment of the invention is described below with reference to FIGS. 3A to 3T, FIGS. 4A and 4B, FIGS. 8A to 8C, and FIGS. 9A to 9D.

Figure 8A:
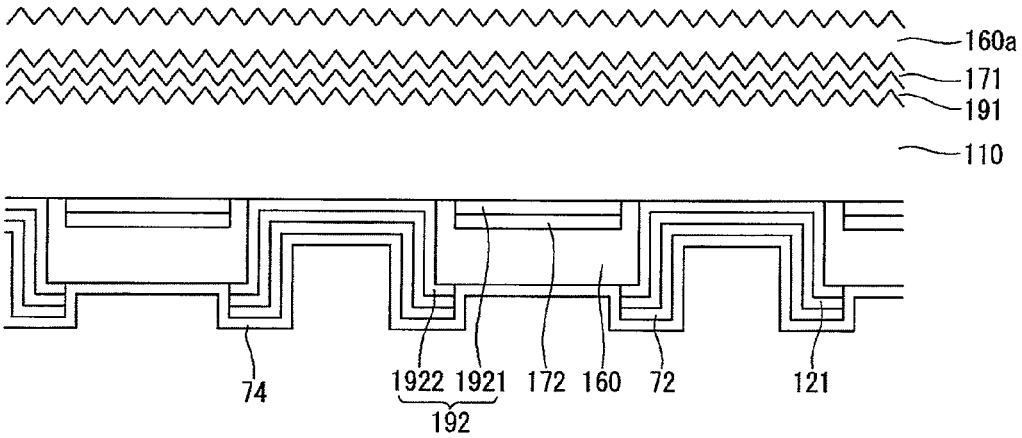
FIGS. 8A to 8C illustrate a portion of a method for manufacturing the solar cell shown in FIG. 7.
Figure 8B:
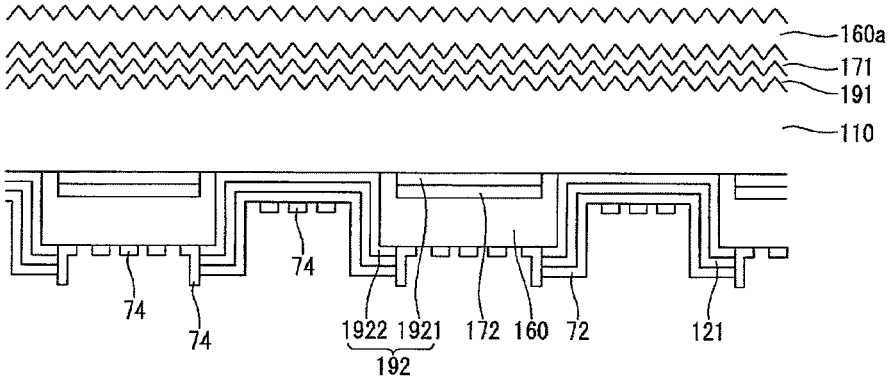
Figure 8C:
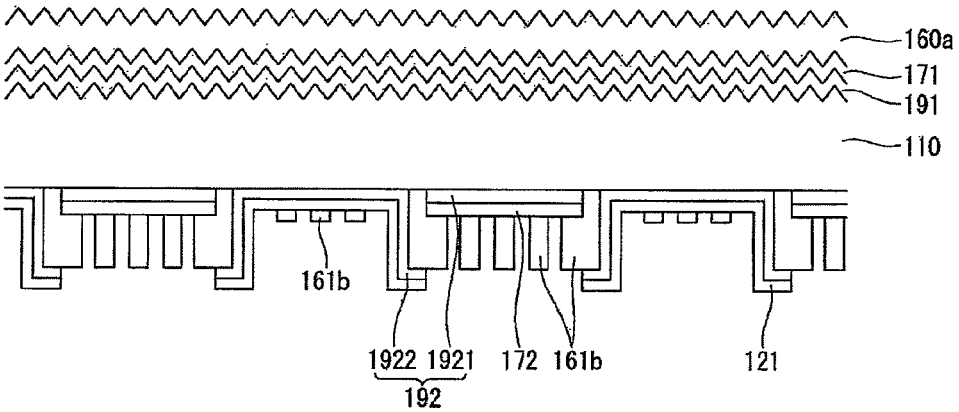

FIGS. 8A to 8C illustrate a portion of a method for manufacturing the solar cell 13 shown in FIG. 7. FIGS. 9A to 9D illustrate a portion of another method for manufacturing the solar cell 13 shown in FIG. 7.

The method for manufacturing the solar cell 13 is similar to the method for manufacturing the solar cell 11 illustrated in FIGS. 3A to 3T and FIGS. 4A and 4B.

More specifically, as shown in FIGS. 3A to 3M, the front passivation layer 191, the FSF region 171, and the first insulating layer 160a are formed on the textured front surface of the substrate 110, and the plurality of first back passivation layers 1921 and the plurality of BSF regions 172 are formed on the back surface of the substrate 110. Further, the plurality of second back passivation layers 1922 and the plurality of emit regions 121 are formed on the back surface of the substrate 110 using the etch stop layer 72 formed of the same material as the insulating layer 160.

However, unlike FIG. 3M, as shown in FIG. 8A, an etch stop layer 74 is again formed on the remaining etch stop layer 72 and the exposed insulating layer 160.

Next, as shown in FIG. 8B, a portion of the etch stop layer 74 is removed, and then the exposed insulating layer 160 and an exposed portion of an etch stop layer 72 formed of the same material as the insulating layer 160 are removed using the remaining etch stop layer 74 as a mask. As shown in FIG. 8C, an insulating layer 160b having a plurality of first and second openings 181 and 182 is formed between the emitter region 121 and the BSF region 172 adjacent to each other, on the plurality of BSF regions 172, and on the plurality of emitter regions 121.

As described above, the processes illustrated in FIGS. 8A to 8C may be performed when the etch stop layer 72 is formed of the same material as the insulating layer 160.

Since the subsequent processes are substantially the same as those illustrated in FIGS. 3P and 3T and FIGS. 4A and 4B, a further description may be briefly made or may be entirely omitted.

However, when the etch stop layer 72 is formed of a material different from the insulating layer 160, the plurality of insulating layers 160b having the plurality of first and second openings 181 and 182 are formed through processes illustrated in FIGS. 9A to 9D.

Figure 9A:
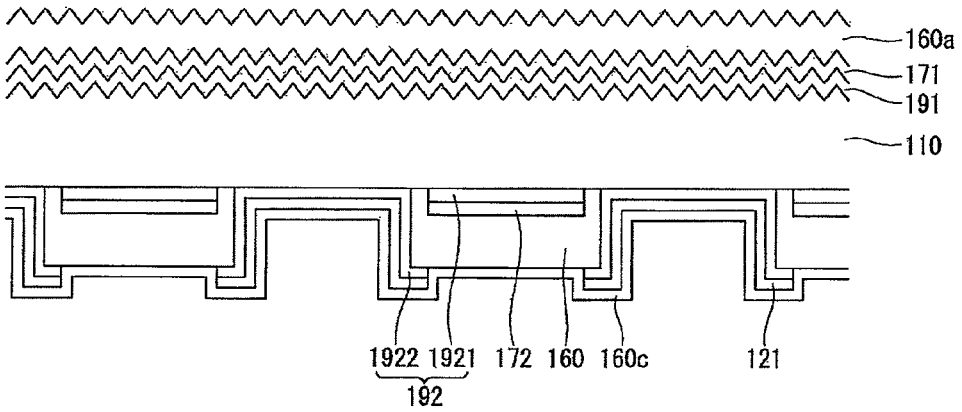
FIGS. 9A to 9D illustrate a portion of another method for manufacturing the solar cell shown in FIG. 7.
Figure 9B:
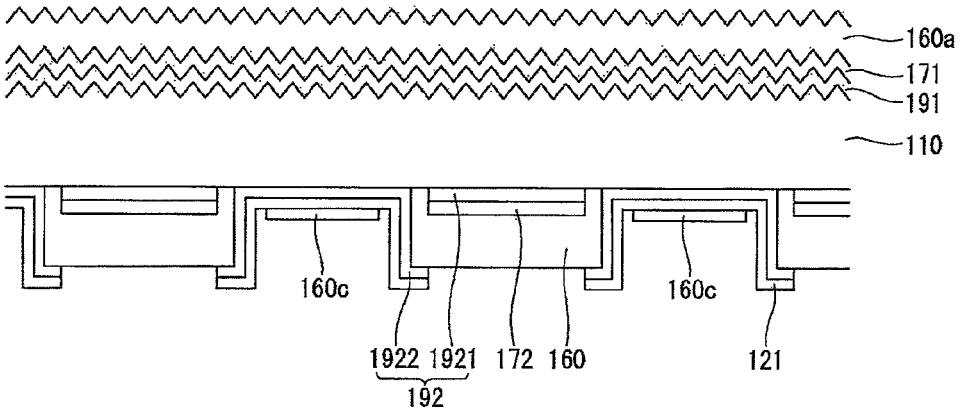

More specifically, as shown in FIG. 9A, after the plurality of second back passivation layers 1922 and the plurality of emitter regions 121 are formed through the process illustrated in FIG. 3M, the etch stop layer 72 is removed. Then, an insulating layer 160c formed of the same material as the insulating layer 160 is formed on the entire back surface of the substrate 110. Next, as shown in FIG. 9B, a portion of the insulating layer 160c is removed, and the insulating layer 160c remains on the plurality of emitter regions 121.

Figure 9C:
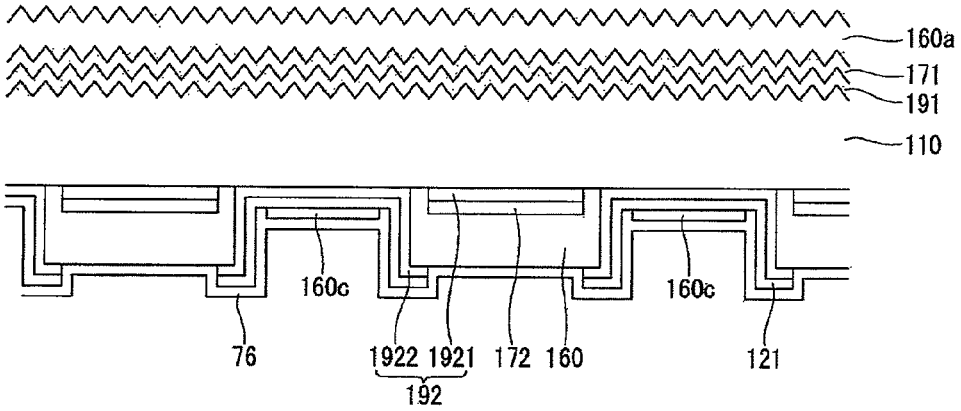
Figure 9D:
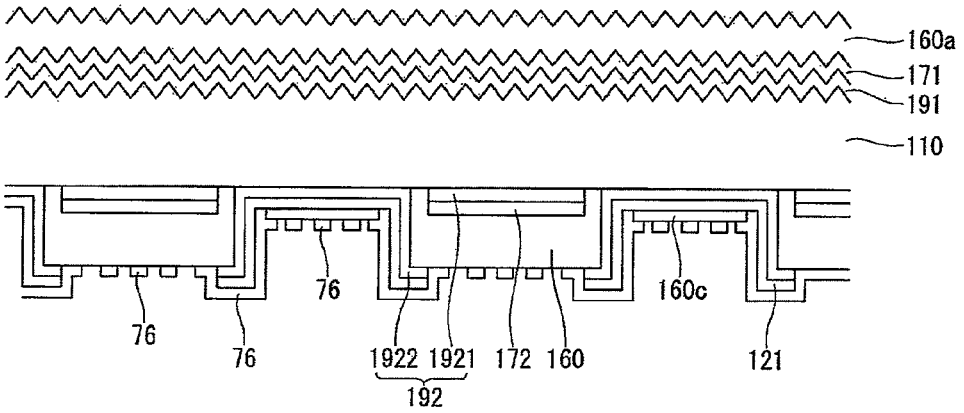

Next, as shown in FIG. 9C, an etch stop layer 76 is formed on the entire back surface of the substrate 110. Next, as shown in FIG. 9D, the etch stop layer 76 having a desired pattern is formed by removing a portion of the etch stop layer 76.

Subsequently, the exposed insulating layers 160 and 160c are removed using the remaining etch stop layer 76 as a mask, and the plurality of insulating layers 160b having the plurality of first and second openings 181 and 182 are formed (refer to FIG. 8C). Since the subsequent processes are substantially the same as those illustrated in FIGS. 3P and 3T and FIGS. 4A and 4B, a further description may be briefly made or may be entirely omitted.

Various solar cells according to another embodiment of the invention are described below with reference to FIGS. 10 to 13.

When comparing with the solar cells illustrated in FIGS. 1, 2, 5 and 7, a formation location of the back passivation layer in the solar cells illustrated in FIGS. 10 to 13 according to another embodiment of the invention is different. Namely, the back passivation layer is positioned between the emitter region and the BSF region adjacent to each other as well as the entire back surface of the substrate 110, unlike the solar cells illustrated in FIGS. 1, 2, 5 and 7.

Figure 10:
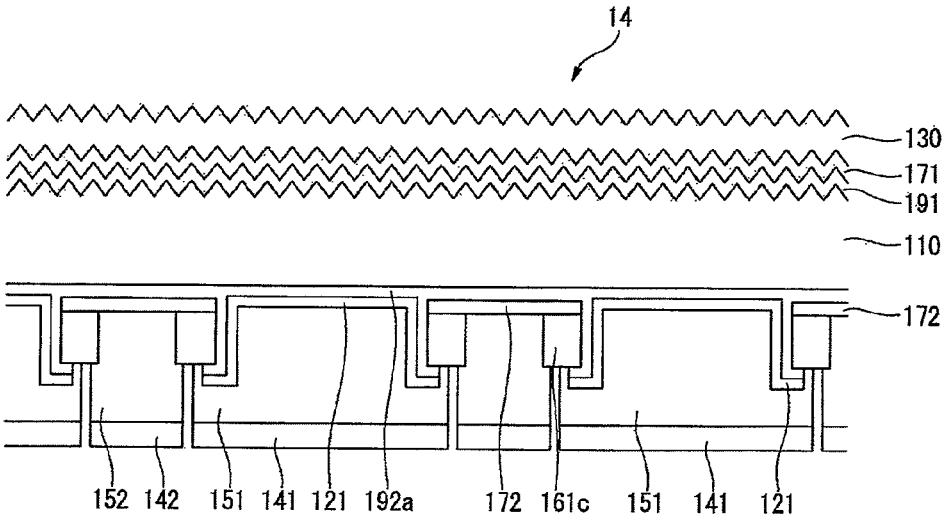
FIG. 10 is a partial cross-sectional view of a solar cell according to another embodiment of the invention.

FIG. 10 is a partial cross-sectional view of a solar cell according to another embodiment of the invention.

As shown in FIG. 10, a solar cell 14 according to another embodiment of the invention has the structure similar to the solar cell 11 shown in FIGS. 1 and 2.

When comparing with the solar cells illustrated in FIGS. 1, 2, 5 and 7, and the solar cell 14 shown in FIG. 10, a formation location of a back passivation layer 192a is different, and a formation location of the insulating region 161c is changed because of changes of the formation location of the back passivation layer 192a.

More specifically, the back passivation layer 192a is positioned on the entire back surface of the substrate 110 and between the emitter region 121 and the BSF region 172 adjacent to each other. The back passivation layer 192a extends between the emitter region 121 and the BSF region 172 in a direction parallel to the emitter region 121 and partially overlaps an edge of the insulating region 161c.

As described above, because the back passivation layer 192a is positioned between the emitter region 121 and the BSF region 172, the insulating region 161c is positioned on only the BSF region 172 as shown in FIG. 10. Further, the insulating region 161c extends along the back passivation layer 192a. In other words, the insulating region 161c extends while adjoining the back passivation layer 192a.

Since configuration of the solar cell 14 shown in FIG. 10 is substantially the same as the solar cell 11 shown in FIGS. 1 and 2 except the formation location of the back passivation layer 192a and the insulating region 161c, a further description may be briefly made or may be entirely omitted.

Similar to the solar cell 11 show in FIGS. 1 and 2, because the back passivation layer 192a, that is formed of intrinsic amorphous silicon and has a large resistivity, is positioned between the emitter region 121 and the BSF region 172 adjacent to each other as well as the back surface of the substrate 110, an insulating effect between the emitter region 121 and the BSF region 172 forming the p-n junction is further improved. Hence, an electrical interference between the emitter region 121 and the BSF region 172 adjacent to each other is further prevented.

Further, the passivation effect of the substrate 110 is greatly improved because of the back passivation layer 192a formed of amorphous silicon having the excellent passivation effect, and the open voltage of the solar cell 14 increases. Hence, the efficiency of the solar cell 14 is further improved.

A method for manufacturing the solar cell 14 according to another embodiment of the invention is almost similar to the method for manufacturing the solar cell 11 illustrated in FIGS. 3A to 3T or FIGS. 4A and 4B.

The method for manufacturing the solar cell 14 is described below with reference to FIGS. 11A to 11H as well as FIGS. 3A to 3T or FIGS. 4A and 4B.

FIGS. 11A to 11H illustrate a portion of a method for manufacturing the solar cell 13 shown in FIG. 10.

Figure 11A:
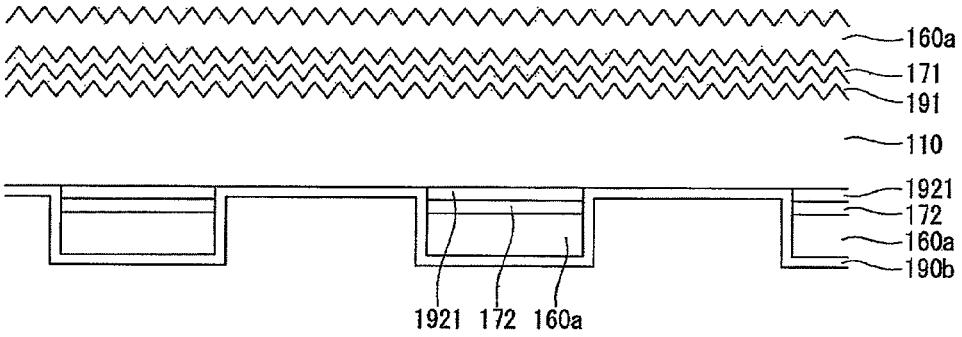
FIGS. 11A to 11H illustrate a portion of a method for manufacturing the solar cell shown in FIG. 10.
Figure 11B:
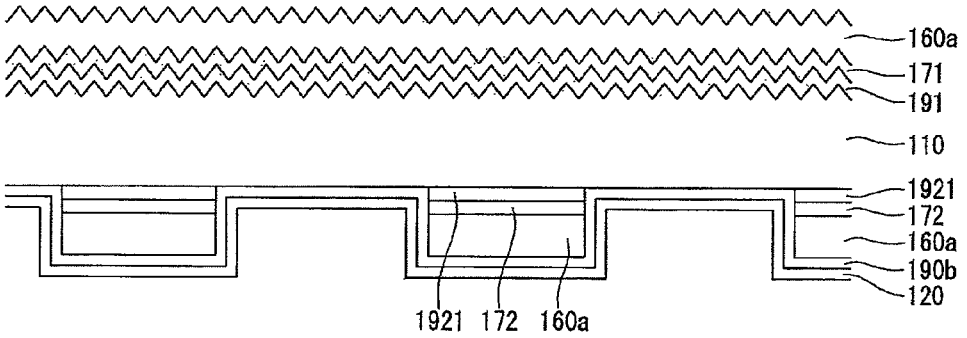

As shown in FIGS. 3A to 3G, the BSF layer 170 and the first back passivation layer 190a positioned on a portion of the back surface of the substrate 110 are removed using the insulating layer 160a on the back surface of the substrate 110 as a mask to form the plurality of back passivation layer 1921. Next, as shown in FIGS. 11A and 11B without going through the processes illustrated in FIGS. 3H and 3I, a second passivation layer 190b formed of the same material (i.e., intrinsic amorphous silicon) as the first passivation layer 190a and a p-type emitter layer 120 formed of amorphous silicon are formed on the back surface of the substrate 110 using the PECVD method, etc.

Figure 11C:
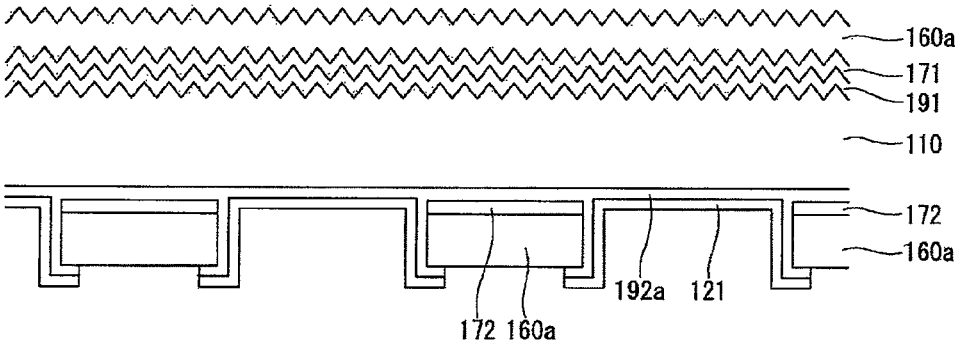

Next, in a manner as shown in FIGS. 3K to 3M, a portion of the emitter layer 120 and a portion of the second passivation layer 190b are removed. As shown in FIG. 11C, the plurality of emitter regions 121 and a plurality of second back passivation layers 192a underlying the emitter regions 121 are formed.

Figure 11D:
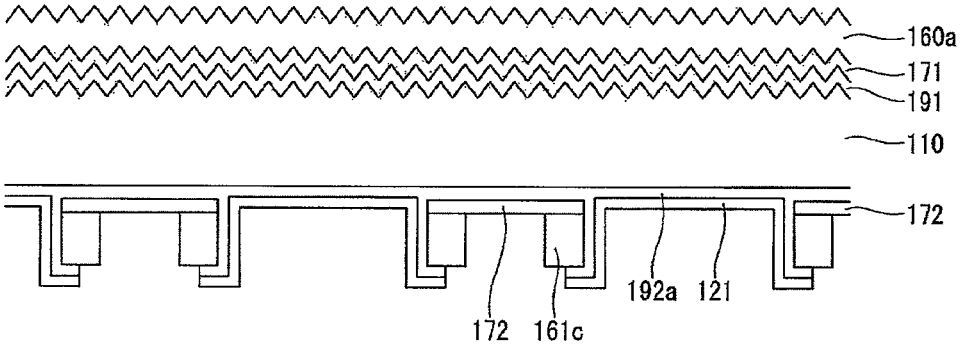
Figure 11E:
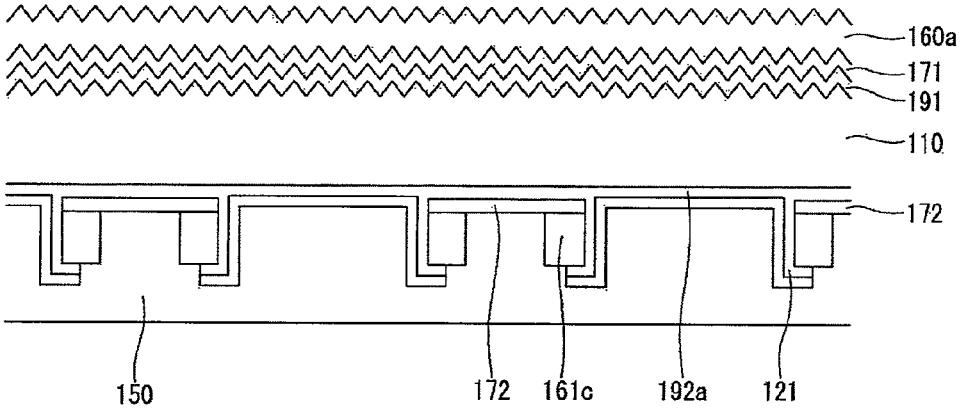
Figure 11F:
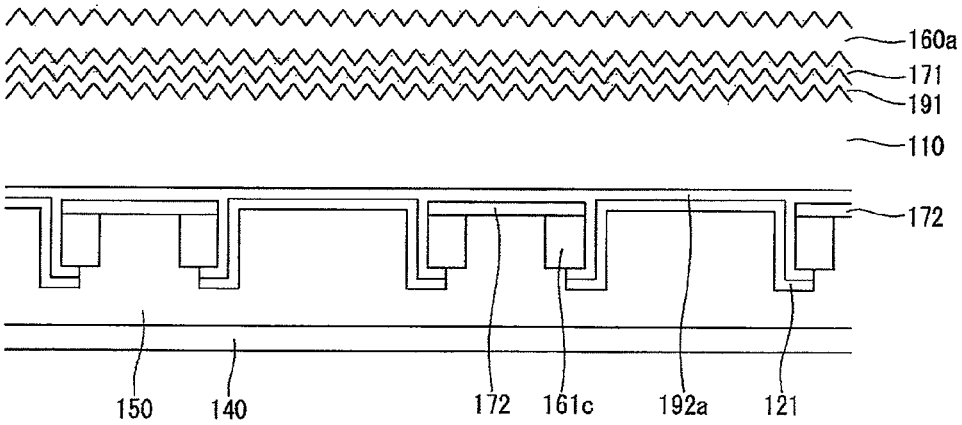
Figure 11G:
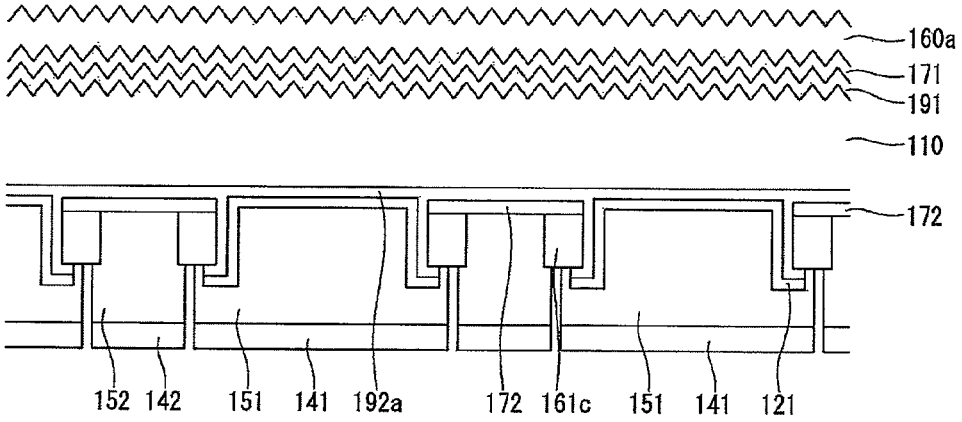
Figure 11H:
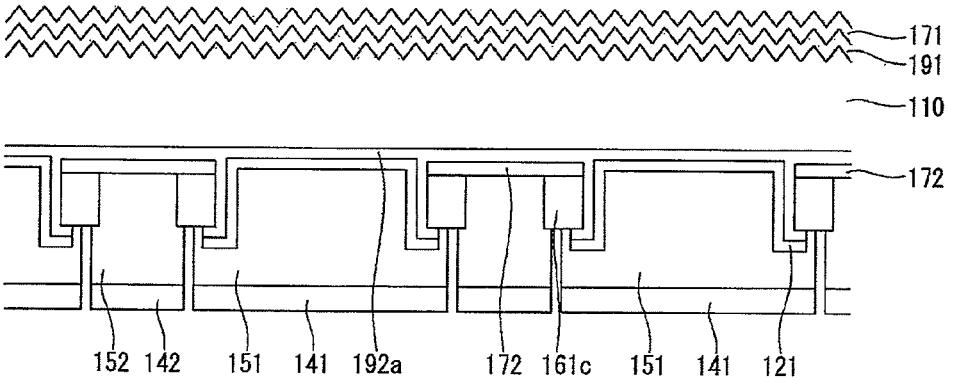

Next, as shown in FIG. 11D, the plurality of insulating regions 161c are formed between the second back passivation layer 192a and the BSF region 172 in the same manner as FIGS. 3N to 3P. Next, in a manner as shown in FIGS. 3Q to 3S or FIGS. 4A and 4B, the first and second auxiliary electrodes 151 and 152 and the first and second electrodes 141 and 142 are formed (refer to FIGS. 11E to 11G). Then, in a manner as shown in FIG. 3T, the anti-reflection layer 130 is formed on the front surface of the substrate 110. As shown in FIG. 11H, the solar cell 14 is completed.

In the solar cell 14, because the process, in which the second passivation layer 190b is again formed on the first passivation layer 190a and then a portion of the second passivation layer 190b is removed, is not necessary, the manufacturing process of the solar cell 14 is simplified.

Figure 12:
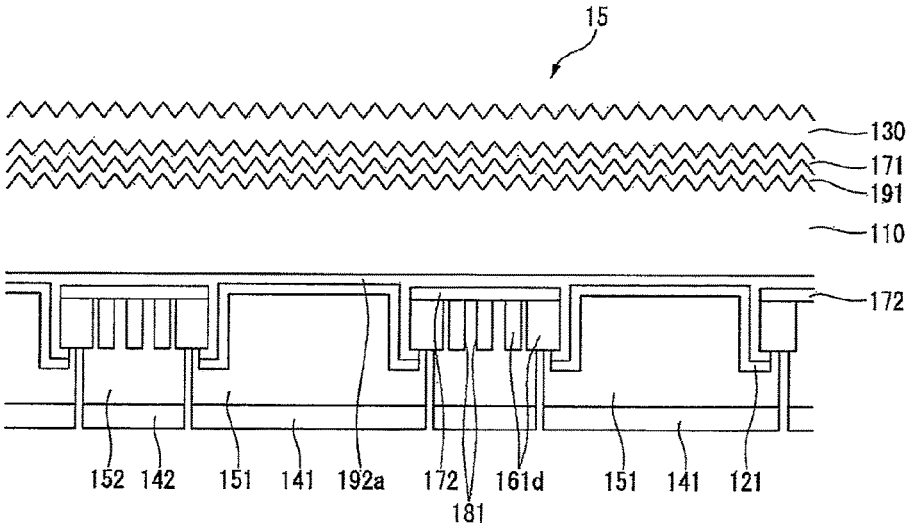
FIG. 12 is a partial cross-sectional view of a solar cell according to another embodiment of the invention.

FIG. 12 is a partial cross-sectional view of a solar cell according to another embodiment of the invention.

A solar cell 15 shown in FIG. 12 has the same configuration as the solar cell 12 shown in FIG. 5 except a formation location of a back passivation layer 192a.

More specifically, a back passivation layer 192a shown in FIG. 12 is positioned on the entire back surface of the substrate 110 and between the emitter region 121 and the BSF region 172 adjacent to each other in the same manner as FIG. 10. The back passivation layer 192a extends between the emitter region 121 and the BSF region 172 in a direction parallel to the emitter region 121 and partially overlaps an edge of an insulating region 161d.

Hence, the insulating region 161d is positioned on only the BSF region 172 and has a plurality of openings 181 as described above with reference to FIG. 5.

Since the configuration of the solar cell 15 illustrated in FIG. 12 is substantially the same as the solar cell 12 illustrated in FIG. 5 except the formation location of each of the back passivation layer 192a and the insulating region 161d, a further description may be briefly made or may be entirely omitted.

As described above with reference to FIG. 10, because the back passivation layer 192a of the solar cell 15 is positioned between the emitter region 121 and the BSF region 172 adjacent to each other as well as the back surface of the substrate 110, an insulating effect between the emitter region 121 and the BSF region 172 is further improved. Hence, an electrical interference between the emitter region 121 and the BSF region 172 adjacent to each other is further prevented. Further, the insulating region 161d is entirely positioned on each BSF region 172 in the same manner as the solar cell 12 shown in FIG. 5, the passivation effect increases because of an increase in a formation area of the insulating region 161d. Further, because a thickness of each of the BSF region 172 and the back passivation layer 192a underlying the insulating region 161d may decrease, the manufacturing time and the manufacturing cost of the solar cell 15 are reduced.

In a method for manufacturing the solar cell 15, in a manner as shown in FIGS. 3A to 3G and FIGS. 11A to 11C, the plurality of emitter regions 121 and the back passivation layer 192a are formed. Next, in a manner as shown in FIGS. 6A and 6B, a pattern is formed by removing a portion of the etch stop layer 73, and the plurality of insulating regions 161d having the plurality of openings 181 are formed on the plurality of BSF regions 172 by removing a portion of the insulating layer 160. Since the subsequent processes are substantially the same as the process for forming the first and second auxiliary electrodes 151 and 152 and the first and second electrodes 141 and 142 and the process for forming the anti-reflection layer 130 on the front surface of the substrate 110 in a manner as illustrated in FIGS. 3Q to 3T or FIGS. 4A an 4B, a further description may be briefly made or may be entirely omitted.

Figure 13:
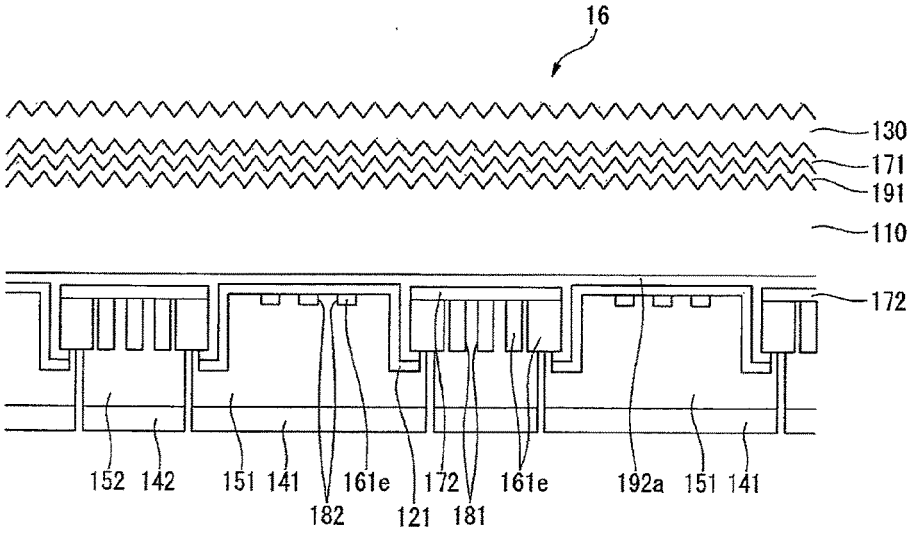
FIG. 13 is a partial cross-sectional view of a solar cell according to another embodiment of the invention.

FIG. 13 is a partial cross-sectional view of a solar cell according to another embodiment of the invention.

A solar cell 16 shown in FIG. 13 has the same configuration as the solar cell 13 shown in FIG. 7 except a formation location of a back passivation layer 192a.

More specifically, a back passivation layer 192a shown in FIG. 13 is positioned on the entire back surface of the substrate 110 and between the emitter region 121 and the BSF region 172 adjacent to each other in the same manner as FIG. 10. The back passivation layer 192a extends between the emitter region 121 and the BSF region 172 in a direction parallel to the emitter region 121 and partially overlaps an edge of an insulating region 161e.

Hence, the plurality of insulating regions 161e are positioned on only the BSF region 172 and only the emitter region 121 and have a plurality of openings 181 and 182 as described above with reference to FIG. 7.

Since the configuration of the solar cell 16 illustrated in FIG. 13 is substantially the same as the solar cell 13 illustrated in FIG. 7 except the formation location of each of the back passivation layer 192a and the insulating region 161e, a further description may be briefly made or may be entirely omitted.

Accordingly, as described above with reference to FIG. 10, an insulating effect between the emitter region 121 and the BSF region 172 is further improved because of the back passivation layer 192a, and an electrical interference between the emitter region 121 and the BSF region 172 adjacent to each other is further prevented.

Further, as shown in FIG. 7, the manufacturing time and the manufacturing cost of the solar cell 16 are reduced because of an increase in a formation area of the insulating region 161e. As a result, the efficiency of the solar cell 16 is further improved.

In a method for manufacturing the solar cell 16, in a manner as shown in FIGS. 3A to 3G and FIGS. 11A to 11C, the plurality of emitter regions 121 and the plurality of back passivation layers 192a are formed. Next, in a manner as shown in FIGS. 8A to 8D or FIGS. 9A to 9D, the plurality of insulating regions 161e, that have the plurality of first openings 181 on the plurality of BSF regions 172 and have the plurality of second openings 182 on the plurality of emitter regions 121, are formed. Since the subsequent processes are substantially the same as the process for forming the first and second auxiliary electrodes 151 and 152 and the first and second electrodes 141 and 142 and the process for forming the anti-reflection layer 130 on the front surface of the substrate 110 in a manner as illustrated in FIGS. 3Q to 3T or FIGS. 4A an 4B, a further description may be briefly made or may be entirely omitted.

The plurality of first and second auxiliary electrodes 151 and 152 have the same plane shape as the plurality of first and second electrodes 141 and 142 positioned on the first and second auxiliary electrodes 151 and 152 as described in FIGS. 10, 12, and 13. However, as described above, the plurality of first and second auxiliary electrodes 151 and 152 and the plurality of first and second electrodes 141 and 142 positioned on the first and second auxiliary electrodes 151 and 152 may have different plane shapes depending on a method for forming the electrodes 141, 142, 151, and 152.

Various solar cells according to another embodiment of the invention are described below with reference to FIGS. 14 to 17. In the following descriptions, structures and components identical or equivalent to those illustrated in FIGS. 1 to 13 are designated with the same reference numerals, and a further description may be briefly made or may be entirely omitted.

FIGS. 14 to 17 are partial cross-sectional views of various solar cells according to other embodiments of the invention.

Solar cells shown in FIGS. 14 to 17 are different from the solar cells illustrated in FIGS. 1 to 13, in that the back passivation layer having the uniform thickness is positioned on the entire back surface of the substrate.

Figure 14:
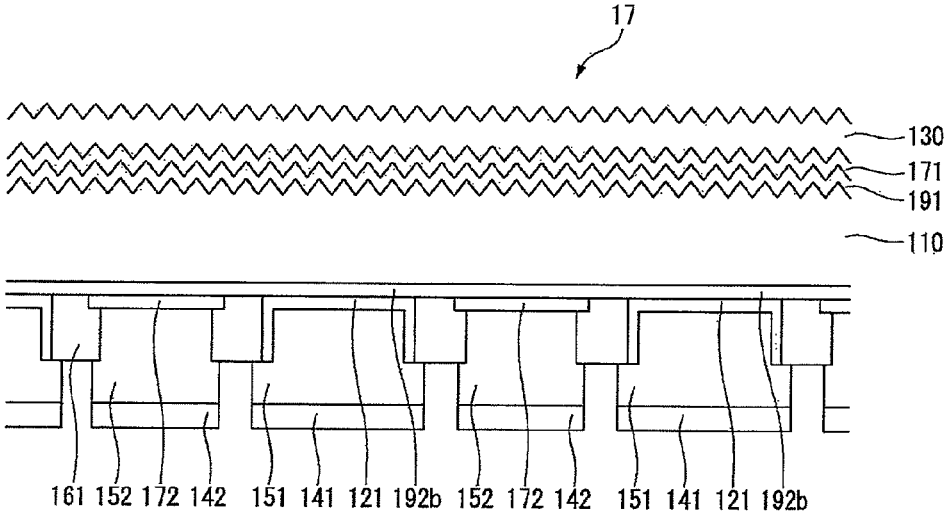
FIGS. 14 to 17 are partial cross-sectional views of various solar cells according to other embodiments of the invention.

A solar cell 17 shown in FIG. 14 has the structure similar to the solar cells shown in FIGS. 2 and 10.

More specifically, the solar cell 17 shown in FIG. 14 includes a front passivation layer 191, a FSF region 171, and an anti-reflection layer 130 that are sequentially positioned on a front surface of a substrate 110, a back passivation layer 192b, a plurality of emitter regions 121, and a plurality of BSF regions 172 that are positioned on a back surface of the substrate 110, a plurality of insulating regions 161 that are positioned between the emitter region 121 and the BSF region 172 adjacent to each other on the back passivation layer 192b and are positioned on a portion of the BSF region 172, a plurality of first auxiliary electrodes 151 that are positioned on the plurality of emitter regions 121 and on a portion of the insulating regions 161, a plurality of second auxiliary electrodes 152 that are positioned on the plurality of BSF regions 172 and on a portion of the insulating regions 161, a plurality of first electrodes 141 positioned on the plurality of first auxiliary electrodes 151, and a plurality of second electrodes 142 positioned on the plurality of second auxiliary electrodes 152.

In the solar cell 17 shown in FIG. 14, the back passivation layer 192b positioned on the entire back surface of the substrate 110 has substantially the uniform thickness, compared with FIG. 10. In this instance, a function, a material, etc. of the back passivation layer 192b are substantially the same as the back passivation layer 192a shown in FIG. 10, except the shape.

Figure 15:
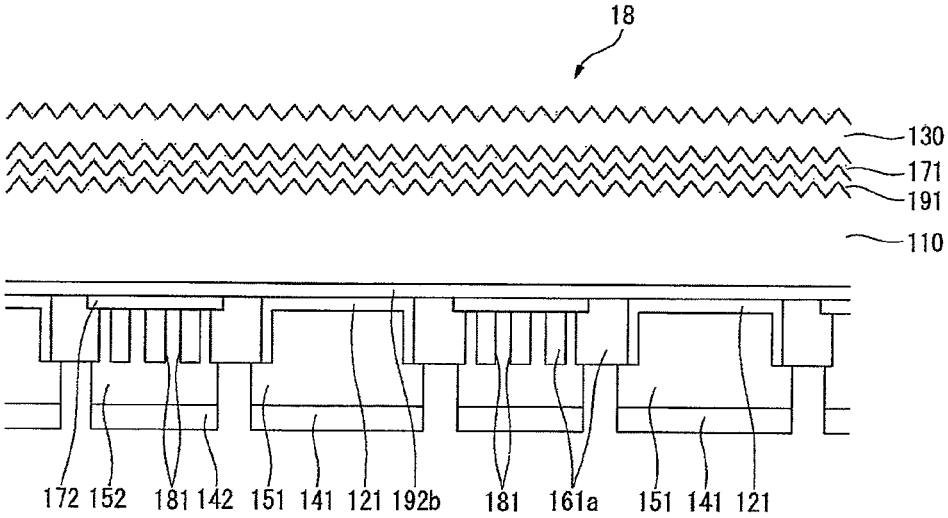

A solar cell 18 shown in FIG. 15 has the same configuration as the solar cell 17 shown in FIG. 14, except that the insulating region 161a is partially positioned on the BSF region 172 as shown in FIG. 5.

Figure 16:
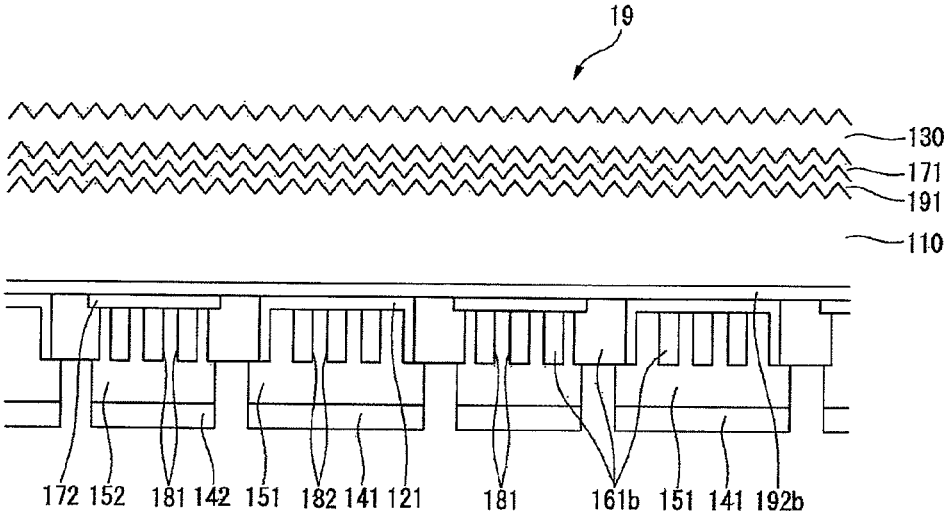

A solar cell 19 shown in FIG. 16 has the same configuration as the solar cell 18 shown in FIG. 15, except that the insulating region 161b is partially positioned on the BSF region 172 and on the emitter region 121. The structure of the insulating region 161b shown in FIG. 16 is similar to FIG. 7.

In the solar cells 17 to 19 shown in FIGS. 14 to 16, the emitter region 121 may be positioned on a portion of the insulating region 161, 161a, or 161b adjacent to the emitter region 121.

Figure 17:
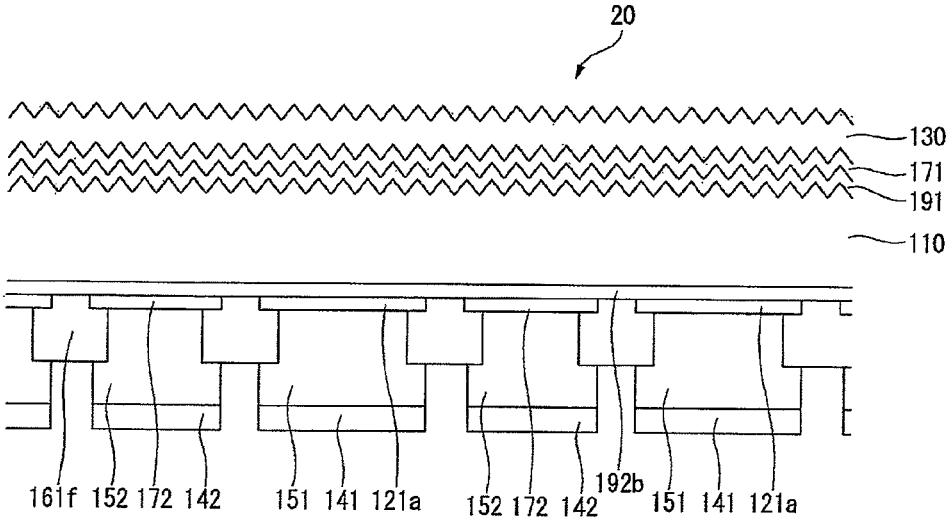

Further, the emitter region 121 shown in FIGS. 14 to 16 may have the same shape as the emitter region 121a shown in FIG. 17. Namely, the emitter region 121a shown in FIG. 17 does not adjoin the side of the insulating region 161 and has the same shape as the BSF region 172. Thus, unlike the insulating region 161, an insulating region 161f shown in FIG. 17 is partially positioned on the emitter region 121a adjacent to the insulating region 161f as well as the BSF region 172 adjacent to the insulating region 161f.

A function, a material, etc. of the insulating region 161f are substantially the same as the insulating region 161 except the formation location.

Because the emitter region 121a does not adjoin the side of the insulating region 161f in FIG. 17, the emitter region 121a may be formed more easily than the emitter region 121 shown in FIGS. 14 and 15. Hence, a solar cell 20 shown in FIG. 17 may be easily manufactured.

The solar cells 17 to 20 shown in FIGS. 14 to 17 have the same effect as at least one of the above-described solar cells 11 to 16, and the back passivation layer 192b shown in FIGS. 14 to 17 is formed through one stacking process. Therefore, the solar cells 17 to 20 shown in FIGS. 14 to 17 may be easily manufactured. In particular, the solar cell 20 shown in FIG. 17 may be more easily manufactured.

In FIGS. 14 to 17, the plurality of first and second auxiliary electrodes 151 and 152 have the same plane shape as the plurality of first and second electrodes 141 and 142 positioned on the first and second auxiliary electrodes 151 and 152. However, as described above, the plurality of first and second auxiliary electrodes 151 and 152 and the plurality of first and second electrodes 141 and 142 positioned on the first and second auxiliary electrodes 151 and 152 may have different plane shapes depending on a method for forming the electrodes 141, 142, 151, and 152.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell, comprising:

a crystalline semiconductor substrate of a first conductive type *and* having a flat rear surface;

a passivation layer positioned directly on the flat rear surface of the substrate;

an emitter region of a second conductive type opposite the first conductive type that is positioned directly on the passivation layer;

a first field region of the first conductive type that is positioned directly on the passivation layer to be separated from the emitter region;

an insulating region including a first portion directly positioned on the flat rear surface of the substrate and a second portion directly positioned on *a rear surface of* at least one of the emitter region and the first field region, and the insulating region being formed of a non-conductive material;

a first electrode positioned on the emitter region and electrically connected to the emitter region; and a second electrode positioned on the first field region and electrically connected to the first field region, wherein the passivation layer has a thickness of 1 nm to 10 nm and a hole or electron is moved through the passivation layer, the passivation layer is formed of at least one of silicon oxide (SiOx) and silicon nitride (SiNx), and the passivation layer includes a first portion positioned between the substrate and the first field region and a second portion positioned between the substrate and the emitter region, the first portion and the second portion of the passivation layer are spatially separated from each other to expose the flat rear surface of the substrate, the first field region directly contacts the first portion of the passivation layer, the emitter region directly contacts the second portion of the passivation layer, and the first portion of the insulating region directly contacts the flat rear surface of the substrate exposed between the first portion and the second portion of the passivation layer.

2. The solar cell of claim 1, wherein when the insulating region is directly positioned on *the rear surface of* the first field region, *the* insulating region is *also* positioned on an edge of the first field region.

3. The solar cell of claim 1, wherein when the insulating region is directly positioned on *the rear surface of* the first field region, *the* insulating region has at least one opening exposing a portion of the first field region.

4. The solar cell of claim 1, wherein the emitter region includes a first portion positioned at a first height and a second portion positioned at a second height greater than the first height.

5. The solar cell of claim 4, wherein when the insulating region is positioned on *the rear surface of* the emitter region, *the* insulating region is positioned on the first portion of the emitter region.

6. The solar cell of claim 5, wherein the insulating region has at least one opening exposing a portion of the first portion of the emitter region.

7. The solar cell of claim 1, wherein the passivation layer is positioned on a surface of the substrate, the surface being opposite an incident surface of the substrate on which light is incident.

8. The solar cell of claim 1, wherein the first field region is formed of a non-crystalline semiconductor.

*9. A solar cell, comprising:*

*a crystalline semiconductor substrate of a first conductive type, having a rear surface and an exposed portion of the rear surface;*

*a front surface field region of the first conductive type positioned on a front surface of the substrate;*

*an anti-reflection layer positioned on the front surface field region;*

*a passivation layer positioned directly on the rear surface of the substrate;*

*an emitter region of a second conductive type opposite the first conductive type that is positioned directly on the passivation layer;*

*a back surface field region of the first conductive type that is positioned directly on the passivation layer to be separated from the emitter region;*

*an insulating region including a first portion and a second portion, the first portion being directly positioned on the exposed portion of the rear surface and the second portion being directly positioned on a rear surface of at least one of the emitter region and the back surface field region, and the insulating region being formed of a non-conductive material;*

*a first electrode positioned on the emitter region and electrically connected to the emitter region; and*

*a second electrode positioned on the back surface field region and electrically connected to the back surface field region,*

*wherein the passivation layer has a thickness of 1 nm to 10 nm and a hole or electron is moved through the passivation layer, the passivation layer is formed of at least one of silicon oxide (SiOx) and silicon nitride (SiNx), and the passivation layer includes a first portion positioned between the rear surface of the substrate and the back surface field region and a second portion positioned between the rear surface of the substrate and the emitter region,*

*the first portion and the second portion of the passivation layer are spatially separated from each other by the first portion of the insulation region at the exposed portion of the rear surface,*

*the back surface field region directly contacts the first portion of the passivation layer,*

*the emitter region directly contacts the second portion of the passivation layer, and*

*the first portion of the insulating region directly contacts the exposed portion of the rear surface between the first portion and the second portion of the passivation layer.*

*10. The solar cell of claim 9, wherein the anti-reflection layer includes at least one of SiNx, SiOx, SiNx:H or SiOx:H.*

*11. The solar cell of claim 9, wherein the front surface of the substrate has a textured surface.*

*12. The solar cell of claim 11, wherein a roughness of the front surface of the substrate is greater than a roughness of the rear surface.*

*13. The solar cell of claim 9, wherein when the insulating region is directly positioned on the back surface field region, the insulating region is positioned on an edge of the back surface field region.*

*14. The solar cell of claim 9, wherein when the insulating region is directly positioned on the back surface field region, the insulating region has at least one opening exposing a portion of the back surface field region.*

*15. The solar cell of claim 9, wherein the emitter region includes a first portion positioned at a first height and a second portion positioned at a second height greater than the first height.*

*16. The solar cell of claim 9, wherein when the insulating region is positioned on the emitter region, the insulating region is positioned on an edge of the emitter region.*

*17. The solar cell of claim 16, wherein the insulating region has at least one opening exposing a portion of the emitter region.*

*18. The solar cell of claim 9, wherein the back surface field region is formed of a non-crystalline semiconductor.*

*19. The solar cell of claim 18, wherein the emitter region is formed of a different semiconductor material from that of the substrate.*

*20. The solar cell of claim 19, wherein the emitter region is formed of a non-crystalline semiconductor.*

*21. The solar cell of claim 20, wherein the emitter region and the substrate form a hetero junction and a pn junction between them.*

*22. The solar cell of claim 20, wherein the emitter region is formed of amorphous silicon.*

*23. The solar cell of claim 9, wherein the crystalline semiconductor substrate of a first conductive type is n-type.*

*24. The solar cell of claim 9, wherein the front surface field region has the same conductive type as the substrate and is more heavily doped with impurities than the substrate.*

*25. The solar cell of claim 9, wherein the front surface field region is formed of amorphous silicon.*

*26. The solar cell of claim 9, wherein the front surface field region is formed of polycrystalline silicon.*

*27. The solar cell of claim 9, wherein the front surface field region is formed of single crystalline silicon.*

*28. The solar cell of claim 10, wherein the anti-reflection layer is formed of a single layer.*

*29. The solar cell of claim 9, further comprising a front passivation layer positioned on the front surface of the substrate.*

*30. The solar cell of claim 29, wherein the front passivation layer has at least one of amorphous silicon, silicon oxide (SiOx) and silicon nitride (SiNx).*

*31. The solar cell of claim 9, wherein a thickness of the passivation layer positioned between the emitter region and the rear surface of the substrate equals a thickness of the passivation layer positioned between the back surface field region and the rear surface of the substrate.*

*32. The solar cell of claim 9, further comprising a first auxiliary electrode positioned between the first electrode and the emitter region.*

*33. The solar cell of claim 32, further comprising a second auxiliary electrode positioned between the second electrode and the back surface field region.*

*34. The solar cell of claim 33, wherein the first and second auxiliary electrodes are formed of a transparent conductive material having conductivity.*

*35. The solar cell of claim 34, wherein the transparent conductive material includes at least one selected from ITO, ZnO, $SnO_2$, TCO or a combination thereof.*

*36. The solar cell of claim 34, wherein the transparent conductive material is doped with at least one of aluminum (Al), germanium (Ge), gallium (Ga), and iron (Fe).*

*37. The solar cell of claim 9, wherein each of the first electrode or the second electrode has a portion directly contacted with the emitter region or the back surface field region and another portion positioned on the second portion of the insulating region.*

*38. The solar cell of claim 9, wherein impurities doped in the front surface field region are the same as impurities doped in the back surface field region.*

*39. The solar cell of claim 9, wherein, in the first electrode or the second electrode, a thickness of a portion directly contacted with the emitter region or the back surface field region is greater than a thickness of another portion positioned on the second portion of the insulating region.*

*40. The solar cell of claim 9, wherein the first electrode or the second electrode is formed of at least one conductive*

*material selected from the group consisting of nickel (Ni), copper (Cu), silver (Ag), aluminum (Al), tin (Sn), zinc (Zn), indium (In), titanium (Ti), gold (Au), or a combination thereof.*

*41. The solar cell of claim 9, wherein the insulating region includes a first insulating layer and a second insulating layer positioned on the first insulating layer.*

*42. The solar cell of claim 41, wherein a thickness of the second insulating layer is less than a thickness of the first insulating layer.*

*43. The solar cell of claim 14, wherein the at least one opening has a stripe shape or an island shape.*

*44. The solar cell of claim 17, wherein the at least one opening has a stripe shape or an island shape.*

*45. The solar cell of claim 14, wherein the first electrode or the second electrode directly contacts the emitter region or the back surface field region through the at least one opening.*

*46. The solar cell of claim 17, wherein the first electrode or the second electrode directly contacts the emitter region or the back surface field region through the at least one opening.*

*47. A solar cell, comprising:*

*a crystalline semiconductor substrate of a first conductive type and having a rear surface and an exposed portion of the rear surface;*

*a front surface field region of the first conductive type positioned on a front surface of the substrate;*

*an anti-reflection layer positioned on the front surface field region;*

*a passivation layer positioned directly on the rear surface of on the substrate;*

*an emitter region of a second conductive type opposite the first conductive type that is positioned directly on the passivation layer;*

*a back surface field region of the first conductive type that is positioned directly on the passivation layer to be separated from the emitter region;*

*an insulating region including a first portion and a second portion, the first portion being directly positioned on the exposed portion of the rear surface and the second portion being directly positioned on a rear surface of at least one of the emitter region and the back surface field region, the insulating region being formed of a non-conductive material, and a width of the first portion being narrower than the second portion;*

*a first electrode positioned on the emitter region and electrically connected to the emitter region; and*

*a second electrode positioned on the back surface field region and electrically connected to the back surface field region,*

*wherein the passivation layer has a thickness of 1 nm to 10 nm and a hole or electron is moved through the passivation layer, the passivation layer is formed of at least one of silicon oxide (SiOx) and silicon nitride (SiNx), and the passivation layer includes a first portion positioned between the substrate and the back surface field region and a second portion positioned between the substrate and the emitter region,*

*the first portion and the second portion of the passivation layer are spatially separated from each other by the first portion of the insulation region at the exposed portion of the rear surface,*

*the back surface field region directly contacts the first portion of the passivation layer,*

*the emitter region directly contacts the second portion of the passivation layer, and*

*the first portion of the insulating region directly contacts the exposed portion of the rear surface between the first portion and the second portion of the passivation layer.*

*48. The solar cell of claim 10, wherein the anti-reflection layer is formed of multiple layers.*

* * * * *